US008890105B2

(12) United States Patent
Nishihara

(10) Patent No.: US 8,890,105 B2
(45) Date of Patent: Nov. 18, 2014

(54) NONVOLATILE MEMORY

(71) Applicant: Kiyohito Nishihara, Yokohama (JP)

(72) Inventor: Kiyohito Nishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/687,737

(22) Filed: Nov. 28, 2012

(65) Prior Publication Data
US 2014/0061565 A1 Mar. 6, 2014

Related U.S. Application Data

(60) Provisional application No. 61/694,442, filed on Aug. 29, 2012.

(51) Int. Cl.
*H01L 29/02* (2006.01)
*H01L 45/00* (2006.01)
*H01L 27/24* (2006.01)

(52) U.S. Cl.
CPC .............. *H01L 45/00* (2013.01); *H01L 45/122* (2013.01); *H01L 27/2481* (2013.01); *H01L 45/145* (2013.01); *H01L 45/1273* (2013.01); *H01L 45/1266* (2013.01); *H01L 45/143* (2013.01); *H01L 45/1233* (2013.01); *H01L 45/142* (2013.01); *H01L 45/1675* (2013.01); *H01L 45/144* (2013.01); *H01L 45/085* (2013.01)
USPC ..... 257/2; 257/3; 257/4; 257/5; 257/E29.002; 438/102; 438/103; 438/104

(58) Field of Classification Search
USPC ................... 257/2–5, E29.002; 438/102–104
See application file for complete search history.

(56) References Cited

U.S. PATENT DOCUMENTS

| 6,815,705 | B2 * | 11/2004 | Klersy et al. ........................ 257/3 |
| 8,027,188 | B2 | 9/2011 | Nagashima et al. |
| 8,085,585 | B2 | 12/2011 | Nagashima et al. |
| 8,242,478 | B2 | 8/2012 | Sakamoto |
| 2004/0069982 | A1 * | 4/2004 | Lowrey et al. ...................... 257/4 |
| 2004/0114413 | A1 * | 6/2004 | Parkinson et al. ............. 365/100 |
| 2009/0141532 | A1 | 6/2009 | Nagashima et al. |
| 2009/0309088 | A1 | 12/2009 | Sakamoto |
| 2011/0241225 | A1 | 10/2011 | Nagashima et al. |

FOREIGN PATENT DOCUMENTS

| JP | 2008-198941 | 8/2008 |
| JP | 2008-306011 | 12/2008 |
| JP | 2009-135131 | 6/2009 |
| JP | 2011-211165 | 10/2011 |
| JP | 2011-238828 | 11/2011 |
| WO | WO 2008/001712 A1 | 1/2008 |

OTHER PUBLICATIONS

U.S. Appl. No. 13/601,200, filed Aug. 31, 2012, Kiyohito Nishihara, et al.

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

A nonvolatile memory according to an embodiment includes a first wiring line; a second wiring line arranged above the first wiring line and extending in a direction crossing the first wiring line; and a resistance change layer arranged in an intersection region of the first wiring line the second wiring line, the second wiring line including a first member extending in the direction in which the second wiring line extends, and an electrode layer containing a metal element arranged on a side surface of the first member along the direction in which the second wiring line extends, a lower surface of the electrode layer being in contact with an upper surface of the resistance change layer.

20 Claims, 20 Drawing Sheets

NONVOLATILE MEMORY

CROSS REFERENCE TO RELATED APPLICATIONS

This application is based upon and claims the benefit of priority from the prior provisional Application 61/694,442 filed on Aug. 29, 2012 in USA, the entire contents of which are incorporated herein by reference.

FIELD

The embodiments described herein relate to nonvolatile memories.

BACKGROUND

Recently, ReRAMs (Resistive Random Access Memories) each including, as a memory cell, a resistance change memory device having a simple stacked structure including an electrode containing a metal element/a resistance change layer/a metal electrode are actively studied.

In such a resistance change memory device, it is desirable that the resistance change layer and the electrode containing a metal element be in contact with each other. If the adhesion between the resistance change layer and the electrode containing a metal element is not sufficient, it is likely that the electrode containing a metal element is removed from the resistance change layer. As a result, the electrode containing a metal element and the resistance change layer are disconnected with each other, thereby decreasing the yield of the memory device.

DETAILED DESCRIPTION

A nonvolatile memory according to an embodiment includes a first wiring line; a second wiring line arranged above the first wiring line and extending in a direction crossing the first wiring line; and a resistance change layer arranged in an intersection region of the first wiring line the second wiring line, the second wiring line including a first member extending in the direction in which the second wiring line extends, and an electrode layer containing a metal element arranged on a side surface of the first member along the direction in which the second wiring line extends, a lower surface of the electrode layer being in contact with an upper surface of the resistance change layer.

Embodiments will now be explained with reference to the accompanying drawings.

(First Embodiment)

Figure 1:
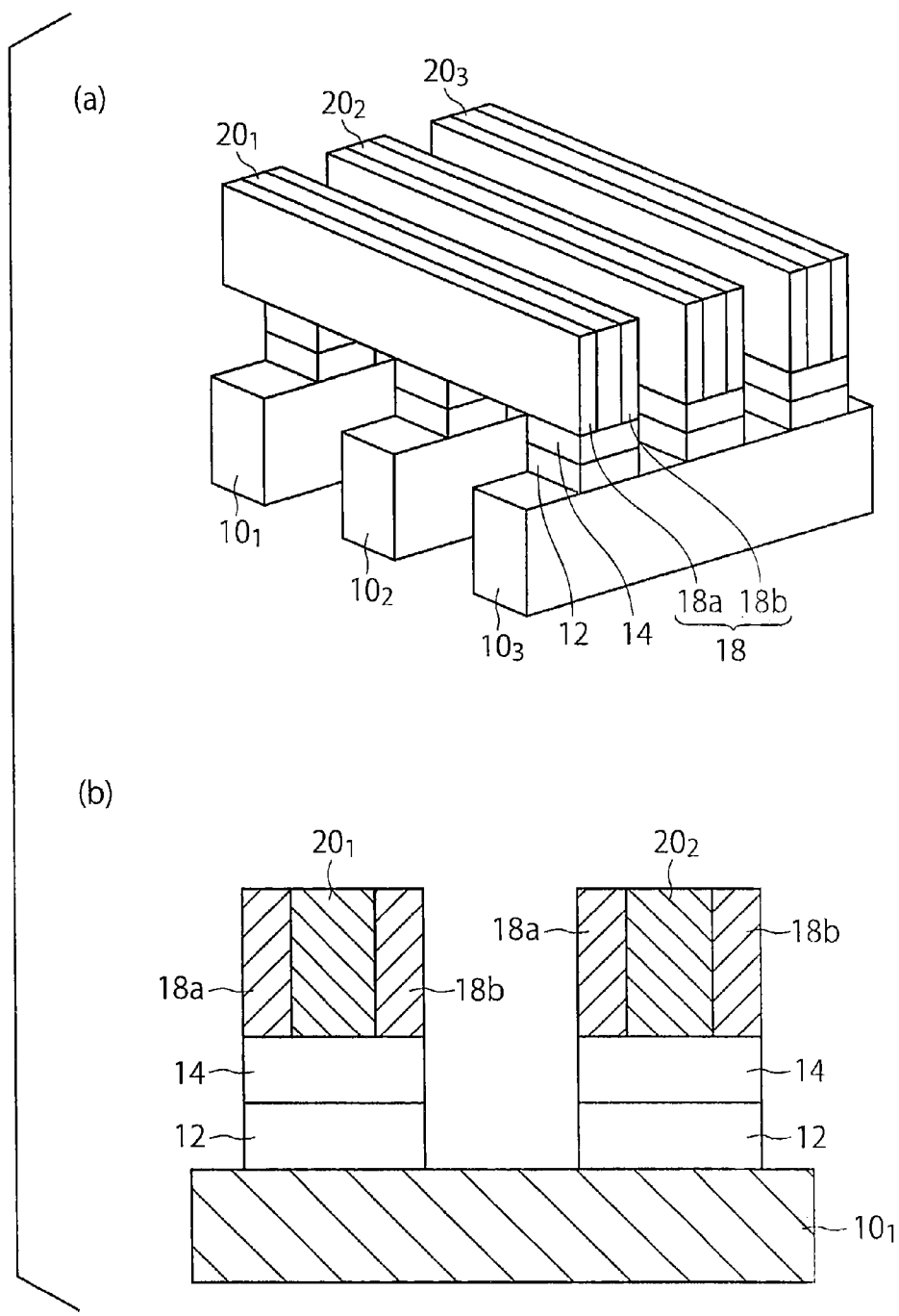
FIGS. 1(a) to 1(b) show a nonvolatile memory according to a first embodiment.

FIGS. 1(a) and 1(b) show a nonvolatile memory according to a first embodiment, which includes a plurality of electrode wiring lines $10_1$-$10_3$ arranged in parallel with each other, a plurality of electrode wiring lines $20_1$-$20_3$ arranged above the electrode wiring line $10_1$-$10_3$ so as to be in parallel with each other and to cross the respective ones of the electrode wiring lines $10_1$-$10_3$, a resistance change layer 14 arranged in each intersection region of the electrode wiring lines $10_1$-$10_3$ and the electrode wiring lines $20_1$-$20_3$, and an electrode layer 18 containing a metal element, provided on a side surface of each electrode wiring line $20_j$ (j=1, . . . , 3). A polycrystalline silicon layer 12 is arranged between the resistance change layer 14 and each electrode wiring line $10_i$ (i=1, . . . , 3). The polycrystalline silicon layer 12 is not necessarily provided. A lower surface of the electrode layer 18 is in contact with a part of an upper surface of the resistance change layer 14. The nonvolatile memory of this embodiment is of cross point type, in which the electrode wiring line $10_i$, the polycrystalline silicon layer 12, the resistance change layer 14, the electrode layer 18, and the electrode wiring line 20; in each intersection region of the electrode wiring line $10_i$ (i=1, . . . , 3) and the electrode wiring line $20_j$ (j=1, . . . , 3) form a memory cell. Incidentally, FIG. 1(a) is a perspective view of the nonvolatile memory according to the first embodiment, and FIG. 1(b) is a cross-sectional view taken along a vertical plane in the direction in which the electrode wiring line $10_1$ extends.

The electrode wiring lines $10_1$-$10_3$ and the electrode wiring lines $20_1$-$20_3$ are formed of a conductive wiring material, such as W (tungsten).

The resistance change layer 14 is formed of an ion conducting material. Examples of ion conducting material including silicon are, for example, amorphous silicon and silicon oxide. Examples of other ion conducting materials are silver oxide ($Ag_2O$), silver sulfide ($Ag_2S$), silver selenide ($Ag_2Se$), silver telluride ($Ag_2Te$), silver iodide (AgI), copper iodide ($CuI_2$), copper oxide (CuO), copper sulfide (CuS), copper selenide (CuSe), copper telluride (CuTe), germanium oxide ($GeO_2$), and the like. The resistance change layer 14 may have a structure in which a plurality of layers each including one of these materials are stacked. Incidentally, the composition ratios of these materials are not limited to those described herein.

It is preferable that the electrode layer 18 be formed of a material having a good adhesion property with respect to the electrode wiring lines $20_1$-$20_3$. For example, a layer containing at least one element selected from the group consisting of Ag (silver), Co (cobalt), Ni (nickel), and Cu (copper), or a layer containing at least two of these elements is used as the electrode layer 18.

Next, the operation of the nonvolatile memory according to the first embodiment will be explained, taking as an example the case where a voltage is applied to a memory cell between one of the electrode wiring lines $10_1$-$10_3$, for example the electrode wiring line $10_3$, and one of the electrode wiring lines $20_1$-$20_3$, for example the electrode wiring line $20_1$. In this case, the electrode layer 18 arranged so as to be in contact with a side surface of the electrode wiring line $20_1$ has a potential identical with that of the electrode wiring line $20_1$, and a voltage is also applied between the electrode layer 18 and the electrode wiring line $10_3$. As a result, the metal element contained in the electrode layer 18, for example Ag, is introduced into the resistance change layer 14 arranged in the intersection region of the electrode wiring line $10_3$ and the electrode wiring line $20_1$, thereby forming a current path called "filament," which is formed of Ag atoms, in the resistance change layer 14 to extend from the electrode layer 18 to the electrode wiring line $10_3$. As a result, the resistance change layer 14 is caused to be in a low resistance state. When the application of the voltage between the electrode wiring line $10_3$ and the electrode wiring line $20_1$ is stopped, the Ag atoms forming the filament diffuse into the resistance change layer 14, so that the current path from the electrode layer 18 to the electrode wiring line $10_3$ does not exist any more. As a result, the resistance change layer 14 is caused to be in a high resistance state. In the first embodiment, electrode layers 18a, 18b are provided both the sides of each of the electrode wiring lines $20_1$-$20_3$. Accordingly, the filament is formed from at least one of the electrode layers toward the resistance change layer 14. Incidentally, only one electrode layer 18 can be provided onto one side surface of each of the electrode wiring lines $20_1$-$20_3$.

In the nonvolatile memory according to the first embodiment thus structured, the electrode layer 18 is provided to a side surface of each of the electrode wiring lines $20_1$-$20_3$, and there is sufficient adhesion between the electrode layer 18 and each of the electrode wiring lines $20_1$-$20_3$. Accordingly, even if the adhesion between the electrode layer 18 and the resistance change layer 14 is not so good, each of the electrode wiring lines $20_1$-$20_3$ supports the electrode layer 18. Therefore, it is possible to prevent the electrode layer 18 from being removed from the resistance change layer 14. Thus, it is possible to prevent the electrical disconnection between the electrode layer 18 and the resistance change layer 14, thereby curbing the decrease in yield.

(Second Embodiment)

Figure 2:
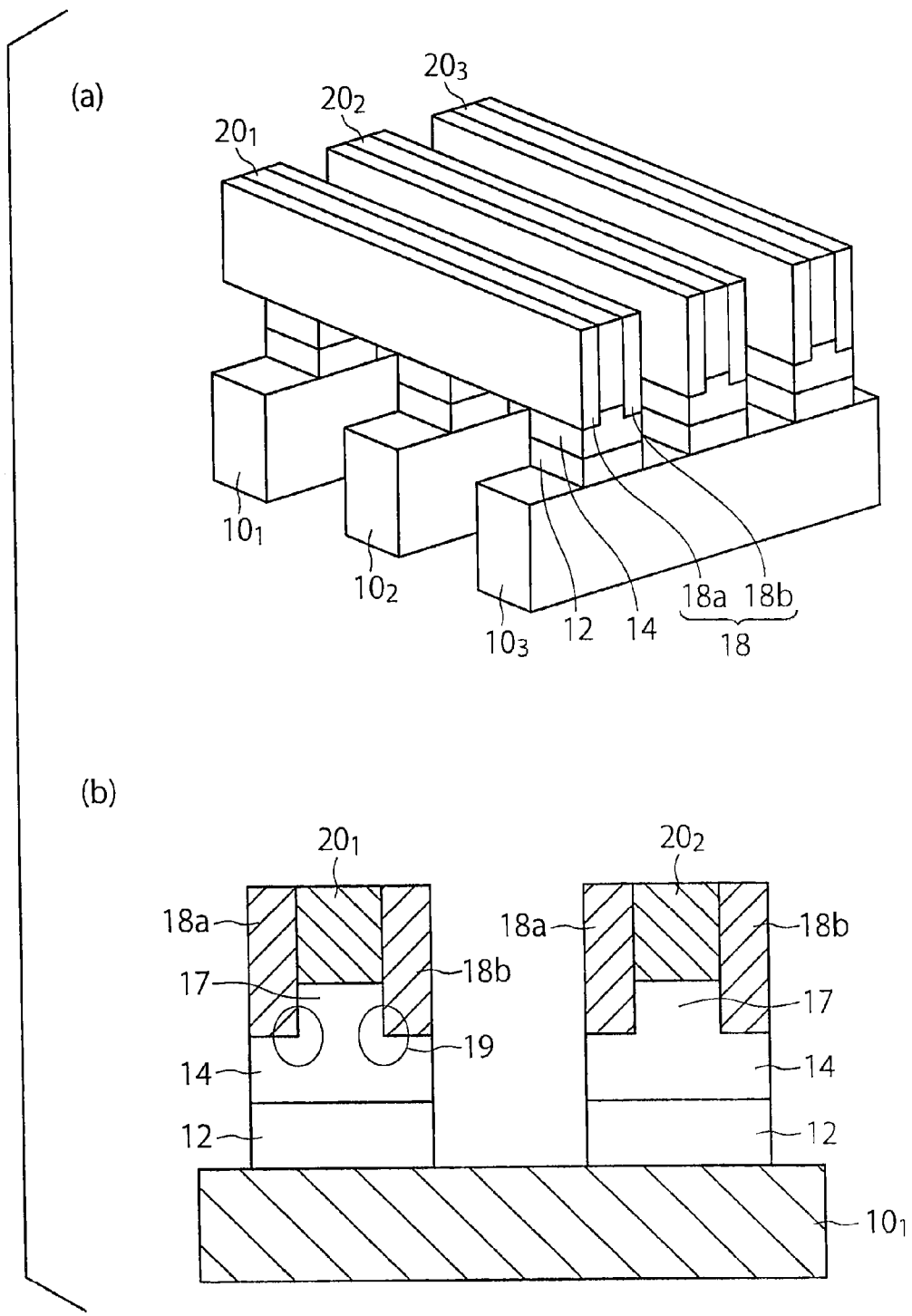
FIGS. 2(a) to 2(b) show a nonvolatile memory according to a second embodiment.

FIGS. 2(a) and 2(b) show a nonvolatile memory according to a second embodiment, which is obtained by providing a projection portion 17 of the same material as the resistance change layer 14 onto the upper surface of the resistance change layer 14, arranging the electrode wiring lines $20_1$-$20_3$ on the projection portion 17, and arranging the electrode layer 18 on the respective side surfaces of the electrode wiring line $20_1$-$20_3$ and the projection portion 17 in the first embodiment. As in the first embodiment, the lower surface of the electrode layer 18 is in contact with the upper surface of the resistance change layer 14. FIG. 2(a) is a perspective view of the nonvolatile memory according to the second embodiment, and FIG. 2(b) is a cross-sectional view taken along a vertical plane, which extends along the direction in which the electrode wiring line $10_1$ extends.

With such a structure, it is possible to increase the electric field intensity of a corner portion 19 at which the upper surface of the resistance change layer 14 and the projection portion 17 are connected. As a result, it is possible to increase the speed for forming the filament, thereby improving the write speed.

Furthermore, as in the first embodiment, it is possible to prevent the electrode layer 18 from being removed from the resistance change layer 14. As a result, it is possible to prevent the electrical disconnection between the electrode layer 18 and the resistance change layer 14, thereby curbing the decrease in yield.

(Third Embodiment)

Figure 3:
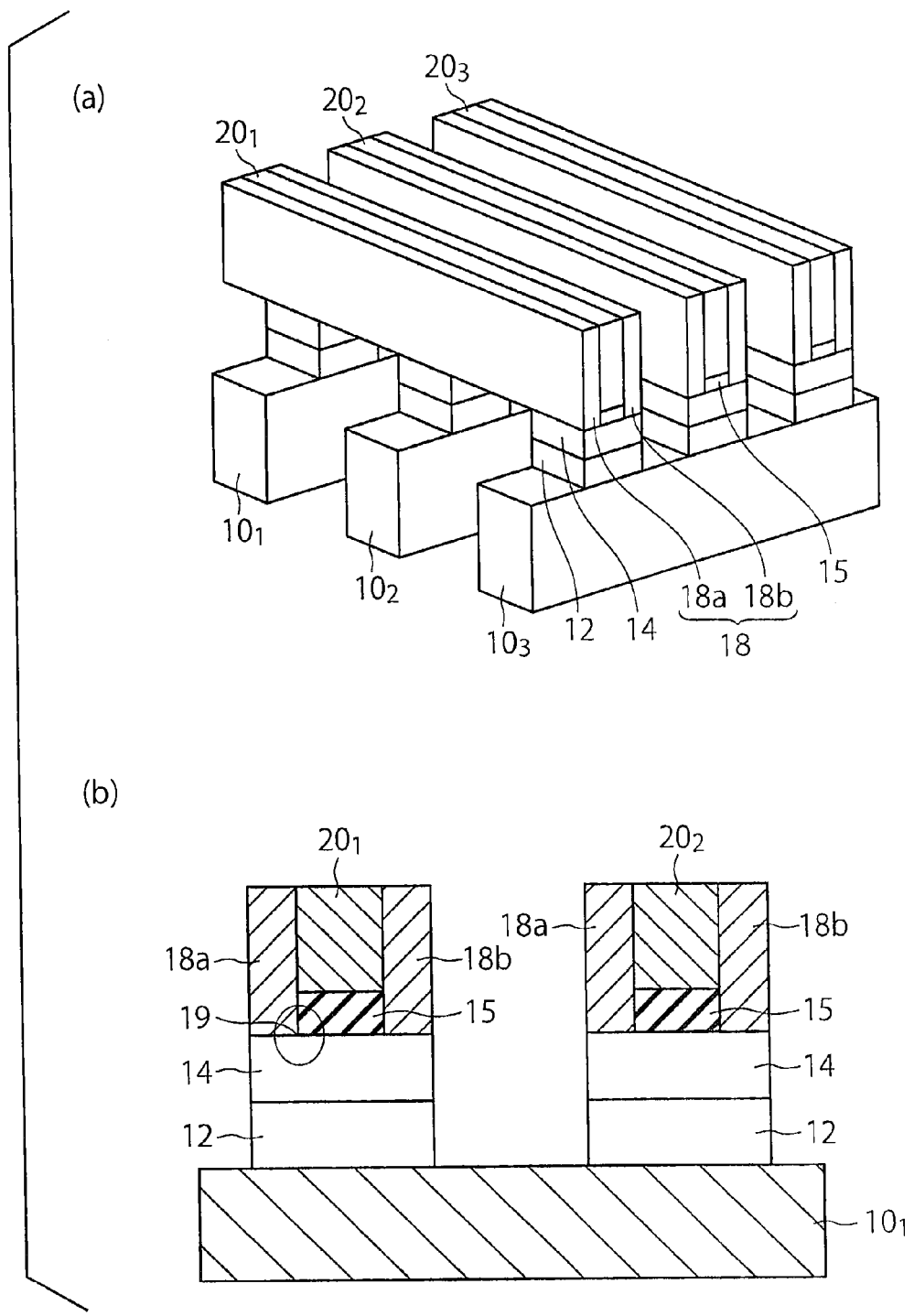
FIGS. 3(a) to 3(b) show a nonvolatile memory according to a third embodiment.

FIGS. 3(a) and 3(b) show a nonvolatile memory according to a third embodiment, which is obtained by replacing the projection portion 17 arranged on the upper surface of the resistance change layer 14 with a projection portion 15 of an insulating material that is different from the material of the resistance change layer 14 in the nonvolatile memory according to the second embodiment.

The insulating material of the projection portion 15 can be, for example, $SiO_x$ (silicon oxide), SiN (silicon nitride), or $AlO_x$ (alumina). If the resistance change layer 14 is formed of amorphous silicon, for example, $SiO_x$ (silicon oxide), SiN (silicon nitride), or $AlO_x$ (alumina) can be used to form the projection portion 15.

By providing the projection portion 15 of an insulating material, it is possible to decrease the leakage current between the electrode wiring lines $20_1$-$20_3$ and the electrode wiring lines $10_1$-$10_3$ as compared with the cases of the first and the second embodiments, thereby decreasing the power consumption.

Furthermore, as in the second embodiment, it is possible to increase the electric field intensity of a corner portion 19 at which the resistance change layer 14 and the projection portion 15 are connected. As a result, it is possible to increase the speed for forming the filament, thereby improving the write speed.

If the resistance change layer 14 is formed of $SiO_x$, the projection portion 15 can be formed of, for example, SiN or $AlO_x$, which is an insulating material with a dielectric constant higher than that of $SiO_x$. On such an occasion, it is possible to increase the electric field intensity of the corner portion 19, at which the resistance change layer 14 and the projection portion 15 are connected, as compared with the case of the second embodiment. As a result, it is possible to increase the speed for forming the filament further, thereby improving the write speed further.

Furthermore, as in the first and the second embodiment, it is possible to prevent the electrode layer 18 from being removed from the resistance change layer 14. As a result, it is possible to prevent the electrical disconnection between the electrode layer 18 and the resistance change layer 14, thereby curbing the decrease in yield.

(Fourth Embodiment)

Figure 4:
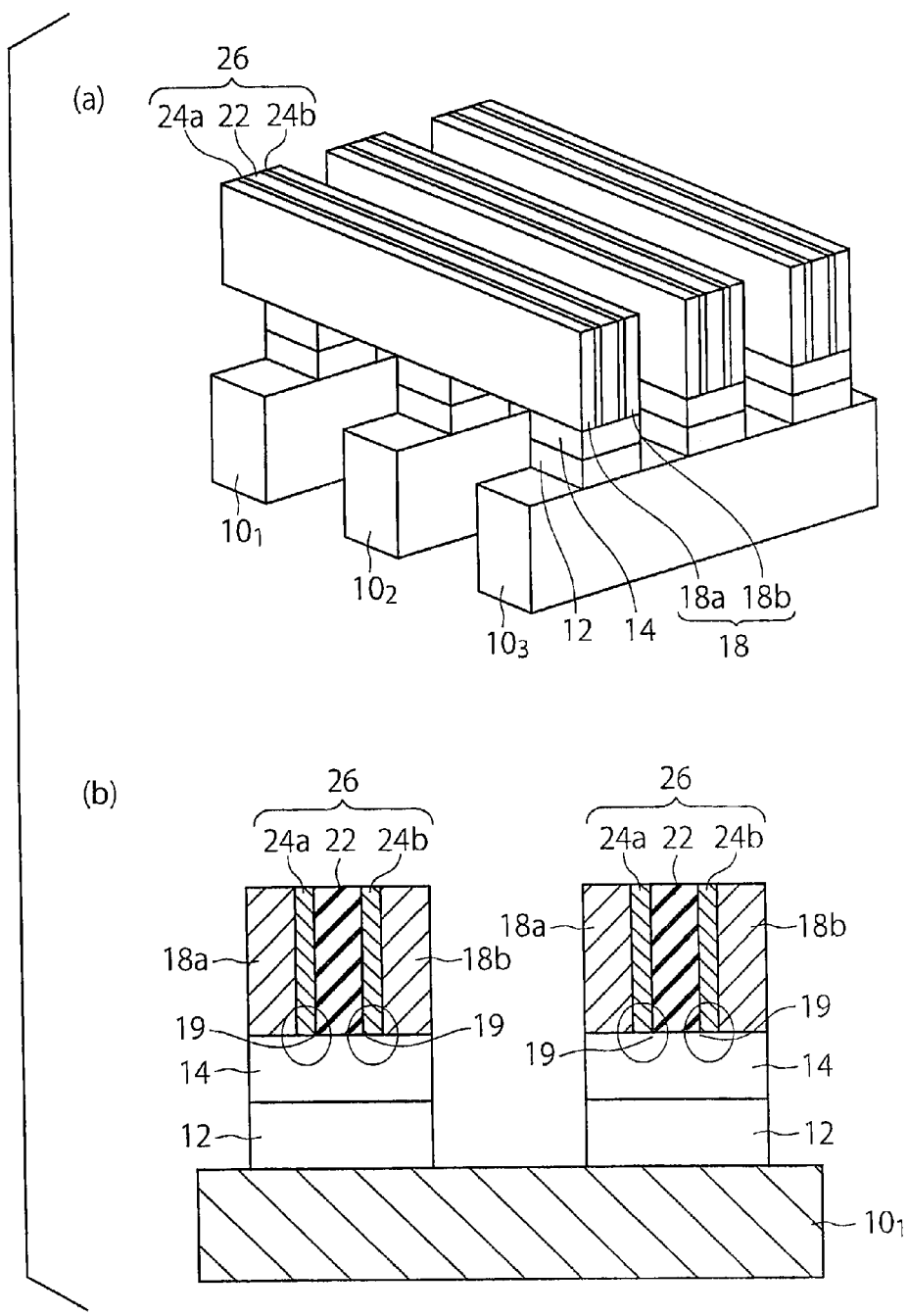
FIGS. 4(a) to 4(b) show a nonvolatile memory according to a fourth embodiment.

FIGS. 4(*a*) and 4(*b*) show a nonvolatile memory according to a fourth embodiment, which is obtained by replacing each of the electrode wiring lines $20_1$-$20_3$ with a stacked body 26 including an insulating layer 22 and barrier metal layers 24*a* and 24*b* in the nonvolatile memory according to the first embodiment.

The insulating layer 22 of the stacked body 26 is arranged between the electrode layer 18*a* and the electrode layer 18*b*, the barrier metal layer 24*a* is arranged between the insulating layer 22 and the electrode layer 18*a*, and the barrier metal layer 24*b* is arranged between the insulating layer 22 and the electrode layer 18*b*. In the fourth embodiment, the electrode layers 18*a* and 18*b* serve as electrodes substituting the electrode wiring lines $20_1$-$20_3$.

The material of the insulating layer 22 can be the same as that of the projection portion 15 explained in the descriptions of the third embodiment. The material of the barrier metal layers 24*a*, 24*b* can be, for example, Ti (titanium), TiN (titanium nitride), W (tungsten), WN (tungsten nitride), Ta (tantalum), or TaN (tantalum nitride).

As in the third embodiment, each insulating layer 22 is provided onto the resistance change layer 14 in the fourth embodiment. Accordingly, it is possible to decrease the leakage current as compared with the cases of the first and the second embodiments, thereby decreasing the power consumption.

Furthermore, as in the second embodiment, it is possible to increase the electric field intensity of a corner portion 19 at which the resistance change layer 14 and the insulating layer 22 are connected. As a result, it is possible to increase the speed for forming the filament, thereby improving the write speed.

Moreover, as in the first and the second embodiments, it is possible to prevent the electrode layer 18 from being removed from the resistance change layer 14. As a result, it is possible to prevent the electrical disconnection between the electrode layer 18 and the resistance change layer 14, thereby curbing the decrease in yield.

(Fifth Embodiment)

Figure 5:
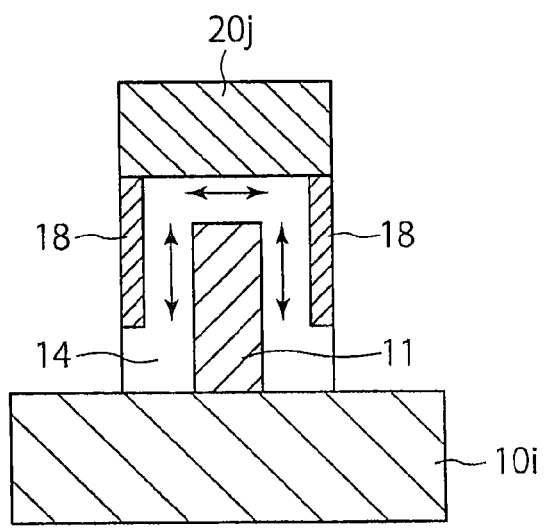
FIG. 5 is a cross-sectional view of a memory cell of a nonvolatile memory according to a fifth embodiment.

FIG. 5 shows a memory cell of a nonvolatile memory according to a fifth embodiment. The nonvolatile memory of the fifth embodiment is obtained by replacing the memory cell of the nonvolatile memory of the first embodiment with the memory cell shown in FIG. 5.

The memory cell of the fifth embodiment shown in FIG. 5 is obtained by providing an electrode 11 having a projecting shape onto the electrode wiring line $10_i$ (i=1, ..., 3), covering upper and side surfaces of the electrode 11 with the resistance change layer 14, covering part of side surfaces of the resistance change layer 14 with the electrode layer 18, and covering the upper surface of the resistance change layer 14 and the upper surface of the electrode layer 18 with the electrode wiring line $20_j$ (j=1, ..., 3). The electrode 11 is formed of a conducting material, for example tungsten or doped polycrystalline silicon. The electrode layer 18 covering part of the side surfaces of the resistance change layer 14 is in a shape surrounding the part of the side surfaces of the resistance change layer 14. The outer diameter of the electrode layer 18 is substantially the same as that of the resistance change layer 14 not covered by the electrode layer 18. The outer diameter herein means a maximum value of the distance between two points in the outer surface of the sectioned area sectioned by a plane parallel to the upper surface of the electrode wiring line $10_i$. If the sectioned area is in a shape of circle, the outer diameter means the diameter of the circle, and if the sectioned area is in a shape of ellipse, the outer diameter means the length of the long axis, and if the sectioned area is in a shape of quadrangle, the outer diameter means the length of the diagonal line. It is preferable that the lower surface of the electrode layer 18 is positioned to be lower than the upper surface of the electrode 11, as shown in FIG. 5.

With such a structure, it is possible to increase the sectioned areas of the electrode layer 18 and the electrode wiring line $20_j$ in contact with the resistance change layer 14, thereby decreasing the wiring resistance, which would increase due to the narrow-width effect in a miniaturizing process. In the fifth embodiment, the function of resistance change element works at the side surfaces of the electrode 11.

Figure 6:
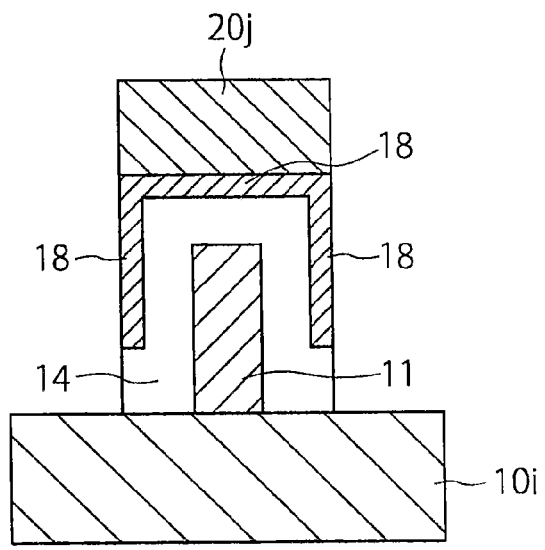
FIG. 6 is a cross-sectional view of a memory cell of a nonvolatile memory according to a modification of the fifth embodiment.

Incidentally, as in a modification of the fifth embodiment shown in FIG. 6, the electrode layer 18 can be formed to cover the upper surface of the resistance change layer 14, and an electrode wiring line $20_j$ (j=1, ..., 3) can be arranged on the electrode layer 18.

Furthermore, as in the first and the second embodiments, it is possible to prevent the electrode layer 18 from being removed from the resistance change layer 14 in the fifth embodiment and its modification. As a result, it is possible to prevent the electrical disconnection between the electrode layer 18 and the resistance change layer 14, thereby curbing the decrease in yield.

(Sixth Embodiment)

A method of manufacturing a nonvolatile memory according to a sixth embodiment will be described by referring to FIGS. 7(*a*) to 9(*b*). The sixth embodiment is a method of manufacturing the nonvolatile memory according to the first embodiment.

Figure 7:
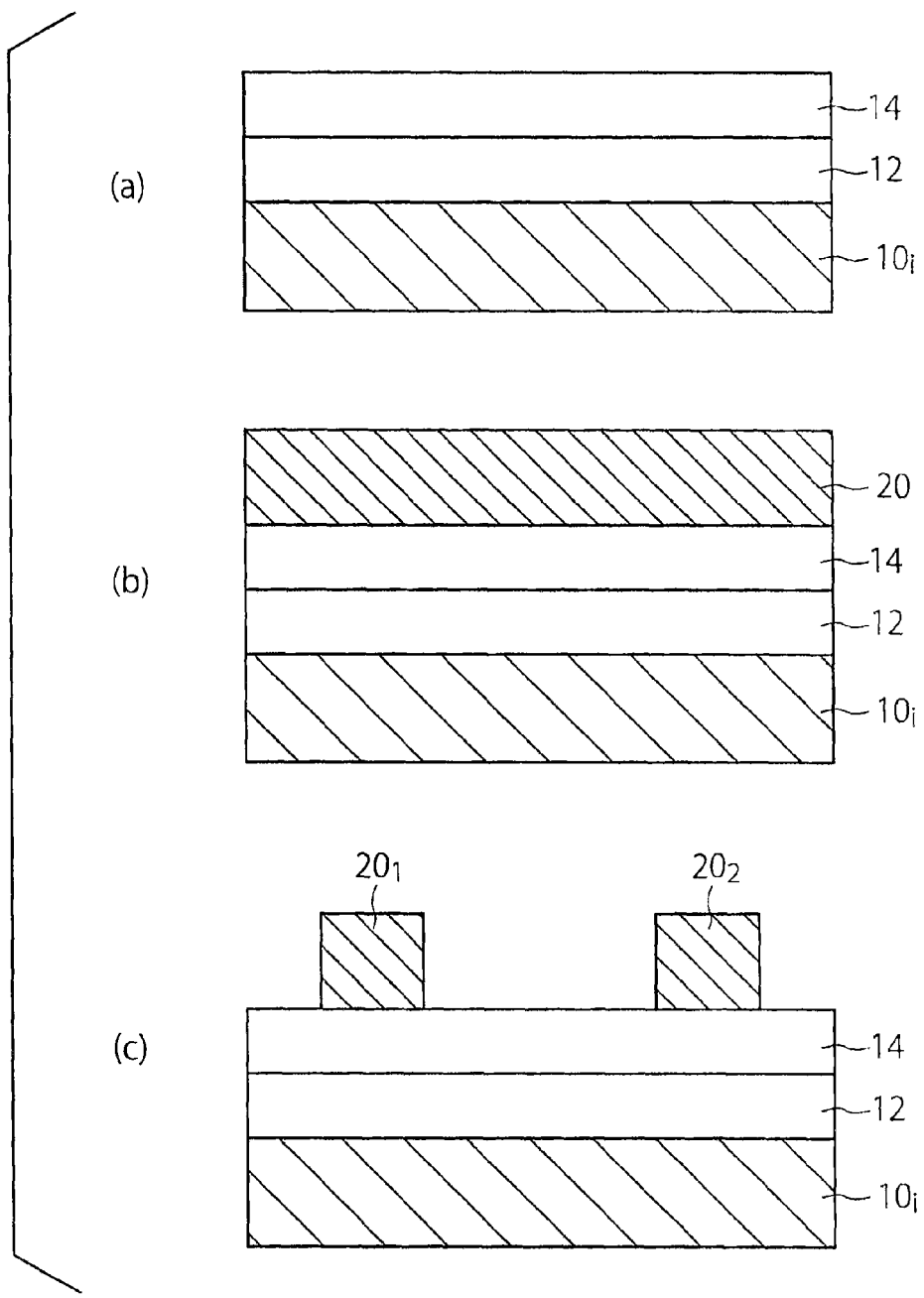
FIGS. 7(a) to 7(c) are cross-sectional views showing a method of manufacturing a nonvolatile memory according to a sixth embodiment.

First, an electrode wiring line material layer of a conducting material, a polycrystalline silicon layer, and a resistance-change-material layer are sequentially stacked, and the resistance-change-material layer, the polycrystalline silicon layer, and the electrode wiring line material layer are patterned using a lithographic technique to have a shape of electrode wiring line to form a stacked structure including an electrode wiring line $10_i$ (i=1, ..., 3), a polycrystalline silicon layer 12, and a resistance change layer 14 (FIG. 7(*a*)). Thereafter, an insulating layer (not shown in the drawings) is deposited so as to fill the spaces between such stacked structures in a shape of electrode wiring lines, and the insulating layer is smoothened using CMP (Chemical Mechanical Polishing) to expose the upper surface of the resistance change layer 14. Consequently, an electrode wiring line material layer 20 is formed over the entire surface (FIG. 7(*b*)). Then, the electrode wiring line material layer 20 is patterned using a lithographic technique to form electrode wiring lines $20_j$ (j=1, ..., 3) (FIG. 7(*c*)).

Figure 8:
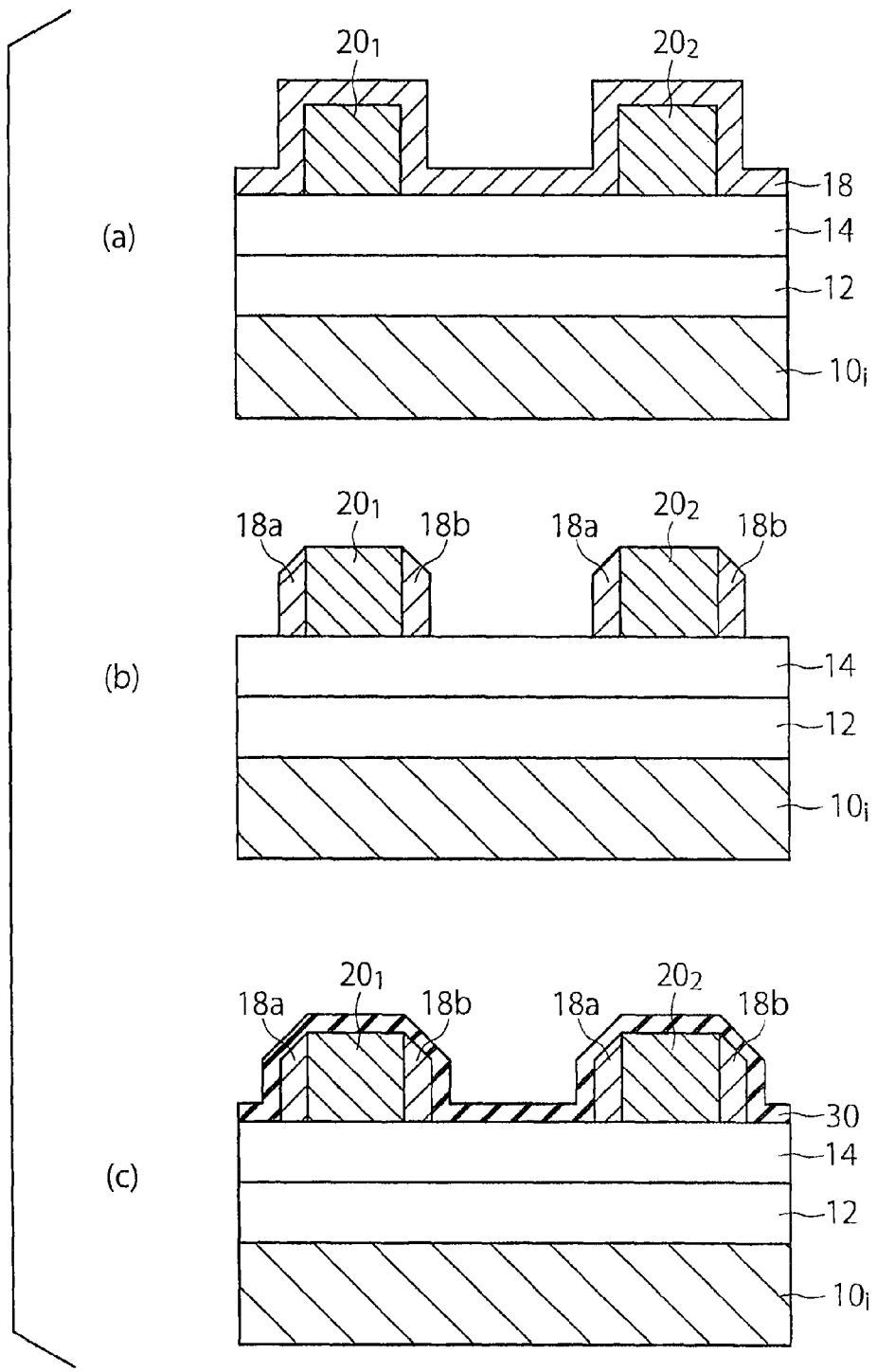
FIGS. 8(a) to 8(c) are cross-sectional views showing the method of manufacturing a nonvolatile memory according to the sixth embodiment.

Next, an electrode material film 18 is formed to cover the resistance change layer 14 and the electrode wiring lines $20_j$ (j=1, ..., 3) (FIG. 8(*a*)). Consequently, the electrode material film 18 is etched using anisotropic etching, for example RIE (Reactive Ion Etching), to form electrode layers 18*a*, 18*b*, which are formed of the electrode material film, on the side surfaces of each electrode wiring line $20_i$ (i=1, ..., 3) (FIG. 8(*b*)). Then, as a protective film for preventing an excessive etching of the electrode layers 18*a*, 18*b*, for example, an SiN film 30 is deposited over the entire surface (FIG. 8(*c*)).

Figure 9:
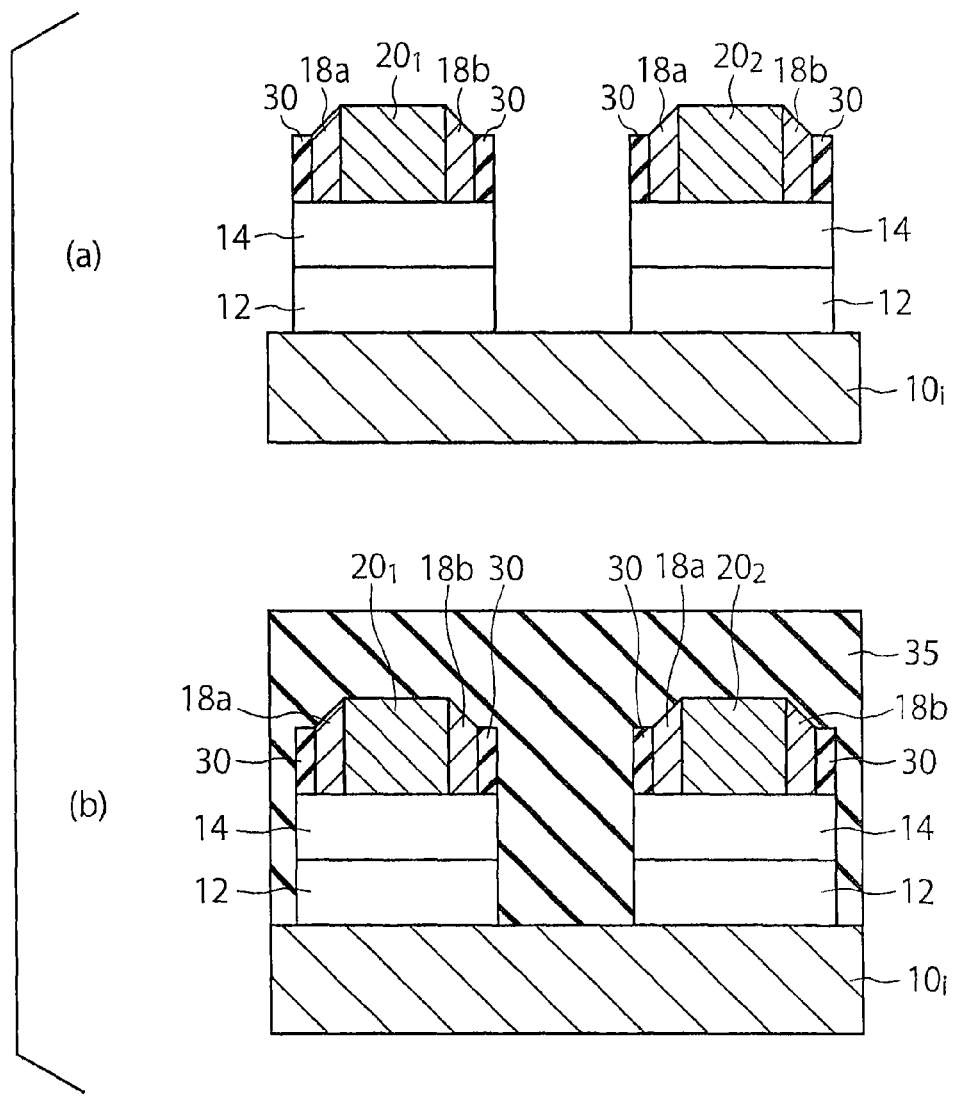
FIGS. 9(a) to 9(b) are cross-sectional views showing the method of manufacturing a nonvolatile memory according to the sixth embodiment.

Next, the protective film 30, the resistance change layer 14, and the polycrystalline silicon layer 12 are patterned to separate memory cells (FIG. 9(a)). On such an occasion, the protective film 30 can remain on the side surfaces of the electrode layers 18a, 18b. This may be left or removed by, for example wet etching or the like. Then, an interlayer insulating film 35 is deposited on the entire surface, and the interlayer insulating film 35 is smoothened by CMP, thereby completing the manufacturing of a memory (FIG. 9(b)).

According to the manufacturing method of the sixth embodiment, after the electrode material film 18 is formed, the electrode layers 18a, 18b are in contact with the respective ones of the electrode wiring lines $20_1$-$20_3$. Accordingly, it is possible to prevent the electrode layers 18a, 18b from being removed from the resistance change layer 14. As a result, it is possible to prevent the electrical disconnection between the electrode layers 18a, 18b and the resistance change layer 14, thereby curbing the decrease in yield.

(Seventh Embodiment)

Figure 10:
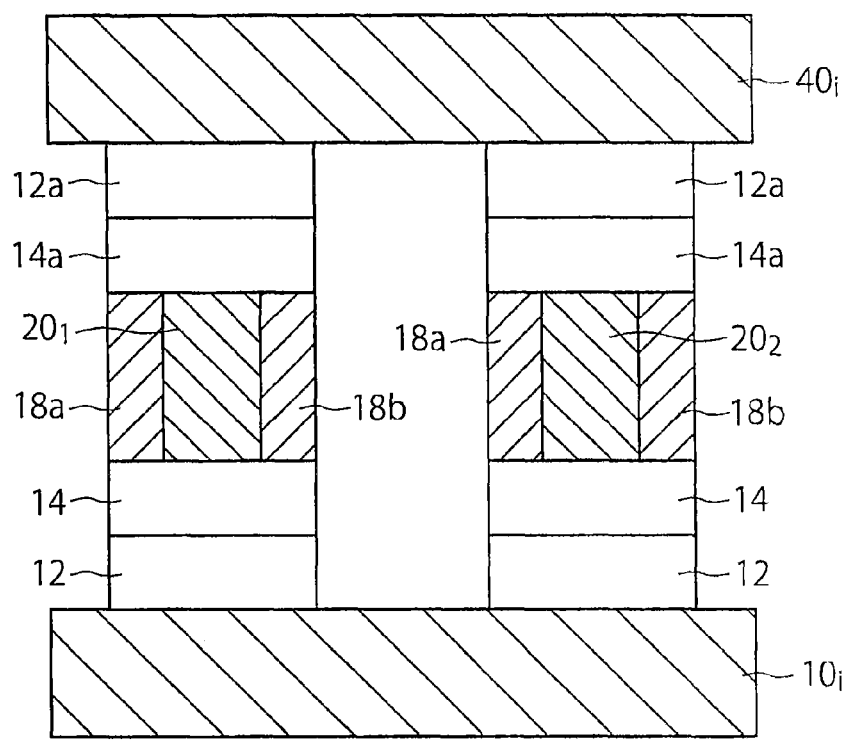
FIG. 10 is a cross-sectional view showing a nonvolatile memory according to a seventh embodiment.

FIG. 10 shows a nonvolatile memory according to a seventh embodiment, which is obtained by providing, onto the memory cell of the nonvolatile memory according to the first embodiment, a memory cell in which the order of stacking layers is reverse to that of the memory cell of the first embodiment, the two memory cells sharing the electrode layers 18a, 18b and the electrode wiring lines $20_j$ (j=1, ..., 3).

That is to say, as in the first embodiment, the nonvolatile memory of the seventh embodiment includes a plurality of electrode wiring lines $10_1$-$10_3$, which are arranged in parallel with each other, electrode a plurality of wiring lines $20_1$-$20_3$, which are arranged in parallel with each other above the electrode wiring lines $10_1$-$10_3$ so as to cross the respective ones of the electrode wiring lines $10_1$-$10_3$, a polycrystalline silicon layer 12 and a resistance change layer 14 arranged in each intersection region of the electrode wiring lines $10_1$-$10_3$ and the electrode wiring lines $20_1$-$20_3$, and an electrode layer 18 containing a metal element, provided onto a side surface of each electrode wiring line $20_j$ (j=1, ..., 3). Furthermore, the nonvolatile memory of the seventh embodiment includes electrode wiring lines $40_1$ which intersect the electrode wiring lines $20_1$-$20_3$ and are provided above the electrode wiring lines $20_1$-$20_3$ and right above the respective electrode wiring lines $10_i$ (i=1, ..., 3), and a resistance change layer 14a and a polycrystalline silicon layer 12a arranged in each intersection region of the electrode wiring lines $20_1$-$20_3$ and the electrode wiring lines $40_1$-$40_3$. The resistance change layer 14a is provided onto each electrode wiring line $20_j$ (j=1, ..., 3) and each electrode layer 18a, 18b. The material of the resistance change layer 14a is the same as that of the resistance change layer 14.

In the nonvolatile memory of the seventh embodiment, the electrode wiring line $10_i$, the polycrystalline silicon layer 12, the resistance change layer 14, the electrode layers 18a, 18b, and the electrode wiring line $20_j$ in each intersection region of the electrode wiring lines $10_i$ (i=1, ..., 3) and the electrode wiring line $20_j$ (j=1, ..., 3) form a first memory cell, and the electrode wiring line $20_j$, the polycrystalline silicon layer 12a, the resistance change layer 14a, the electrode layers 18a, 18b, and the electrode wiring line $40_i$ in each intersection region of the electrode wiring lines $20_j$ (j=1, ..., 3) and the electrode wiring lines $40_i$ (i=1, ..., 3) form a second memory cell. That is to say, the second memory cell is formed on the first memory cell, and the stacking order of the second memory cell is opposite to that of the first memory cell.

As described above, as in the first embodiment, it is possible to prevent the electrode layers 18a, 18b of the first memory cell from being removed from the resistance change layer 14 in the seventh embodiment. In addition, in the seventh embodiment, it is possible to prevent the electrode layers 18a, 18b of the second memory cell from being removed from the resistance change layer 14a. As a result, it is possible to prevent the electrical disconnection between the electrode layers 18a, 18b and the resistance change layers 14, 14a, thereby curbing the decrease in yield.

Although the memory cell of the first embodiment is used to describe the seventh embodiment, it is possible to use the memory cell of any of the second to the fourth embodiments instead of the memory cell of the first embodiment. For example, as the first and the second memory cells of the seventh embodiment, the memory cell of the fourth embodiment may be used.

(Eighth Embodiment)

A method of manufacturing a nonvolatile memory according to an eighth embodiment will be described with reference to FIG. 7(a) and FIGS. 11(a) to 14(c). The eighth embodiment is a method of manufacturing the nonvolatile memory of the seventh embodiment shown in FIG. 10.

Figure 11:
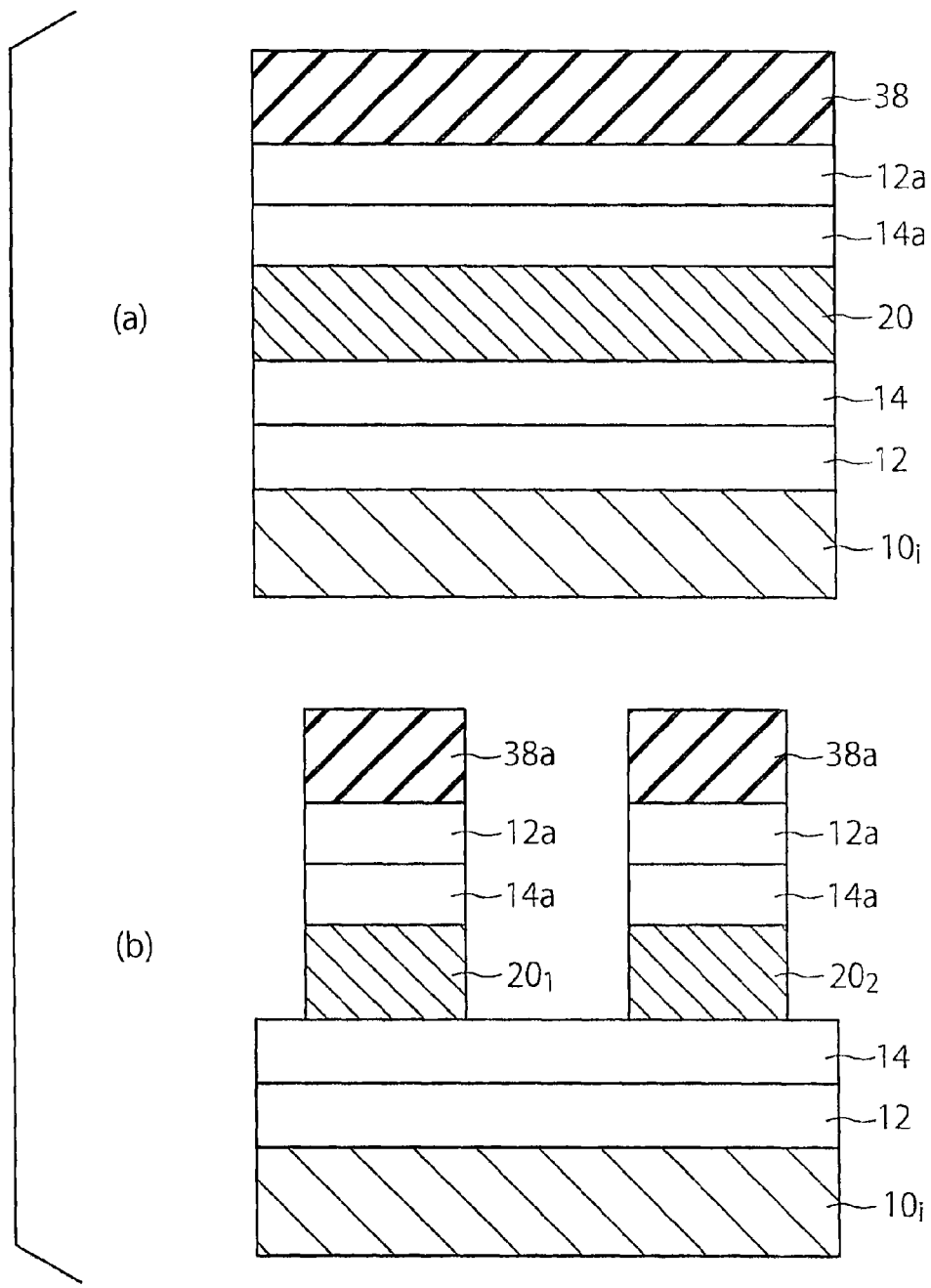
FIGS. 11(a) to 11(b) are cross-sectional views showing a method of manufacturing a nonvolatile memory according to an eighth embodiment.
Figure 12:
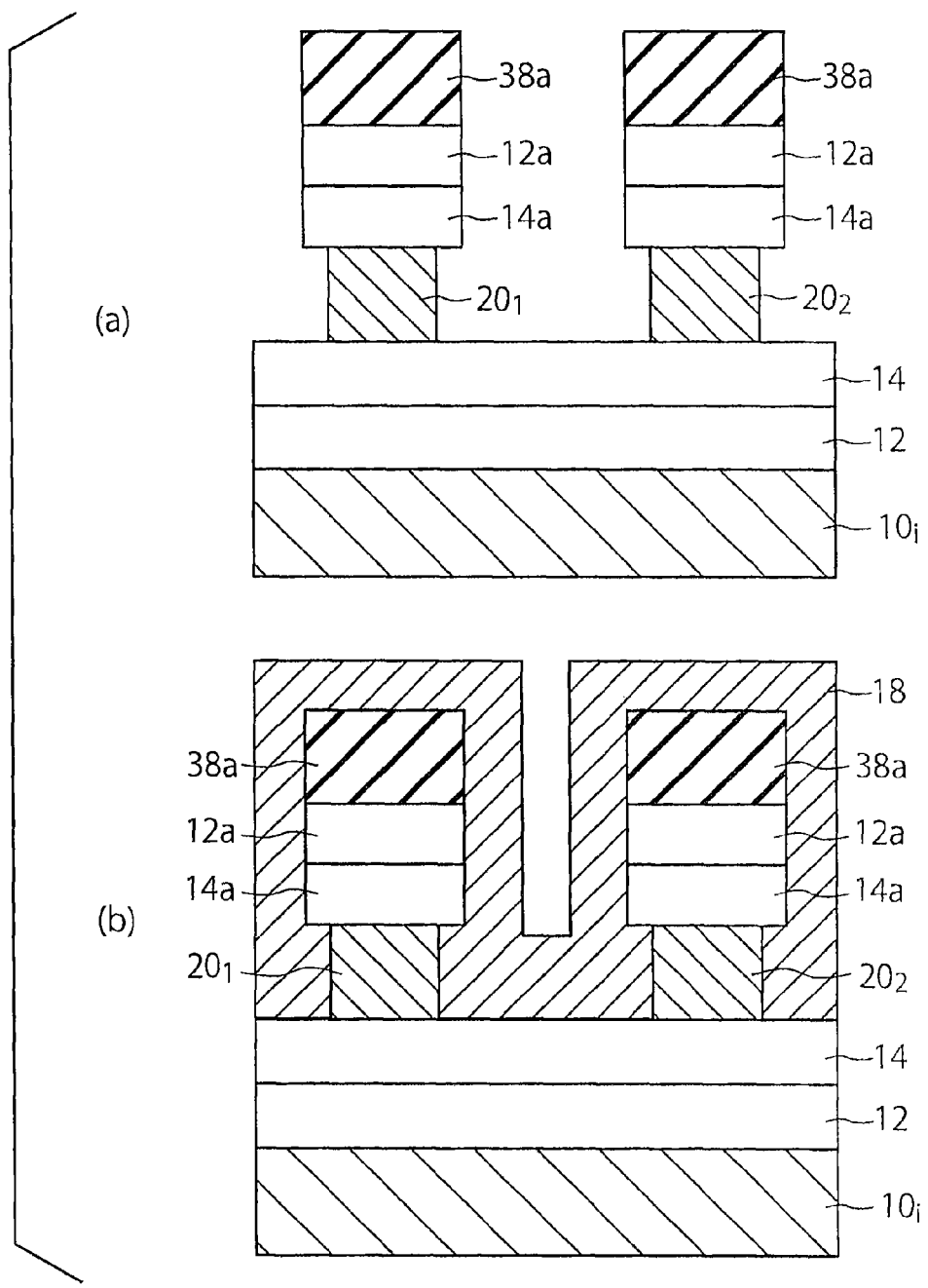
FIGS. 12(a) to 12(b) are cross-sectional views showing the method of manufacturing a nonvolatile memory according to the eighth embodiment.

First, an electrode wiring line material layer of a conducting material, a polycrystalline silicon layer, and a resistance-change-material layer are sequentially stacked, and the resistance-change-material layer, the polycrystalline silicon layer, and the electrode wiring line material layer are patterned using a lithographic technique to have a shape of electrode wiring line, thereby forming a stacked structure including an electrode wiring line $10_i$ (i=1, ..., 3), a polycrystalline silicon layer 12, and a resistance change layer 14 (FIG. 11 (a)). Thereafter, an insulating layer (not shown in the drawings) is deposited to fill the spaces between such stacked structures in the shape of electrode wiring lines, and the insulating layer is smoothened by using CMP (Chemical Mechanical Polishing) to expose the upper surface of the resistance change layer 14. Consequently, an electrode wiring line material layer 20 of a conducting material, a resistance change layer 14a, a polycrystalline silicon layer 12a, and a hard mask material layer 38 are sequentially deposited on the entire surface (FIG. 11(a)). The hard mask material layer 38 may be formed of alumina (AlOx), silicon nitride (SiN), etc.

Next, the hard mask material layer is patterned using a lithographic technique to form a hard mask 38a. Using this hard mask 38a, the polycrystalline silicon layer 12a, the resistance change layer 14a, and the electrode wiring line material layer 20 are patterned to form the polycrystalline silicon layer 12a, the resistance change layer 14a, and the electrode wiring line $20_j$ (j=1, ..., 3) separated into a cell (FIG. 11(b)).

Then, by using, for example, wet etching or isotropic dry etching, the side portions of the electrode wiring line $20_j$ (j=1, ..., 3) are etched to narrow the width of the electrode wiring line $20_j$ (j=1, ..., 3) (FIG. 12(a)). Consequently, an electrode material film 18 is deposited to fill the etched side portions of the electrode wiring line $20_j$ (j=1, ..., 3) (FIG. 12(b)).

Figure 13:
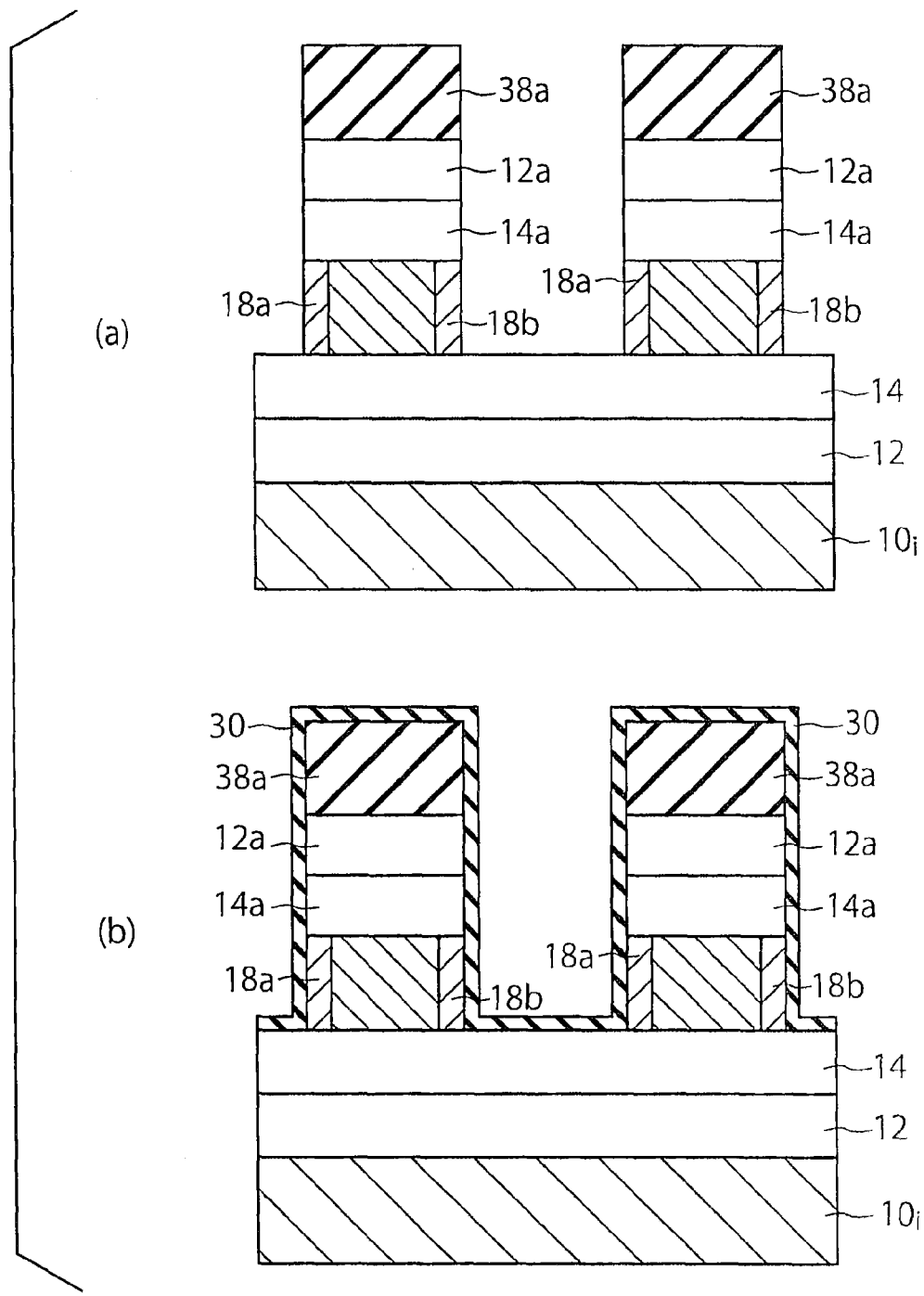
FIGS. 13(a) to 13(b) are cross-sectional views showing the method of manufacturing a nonvolatile memory according to the eighth embodiment.
Figure 14:
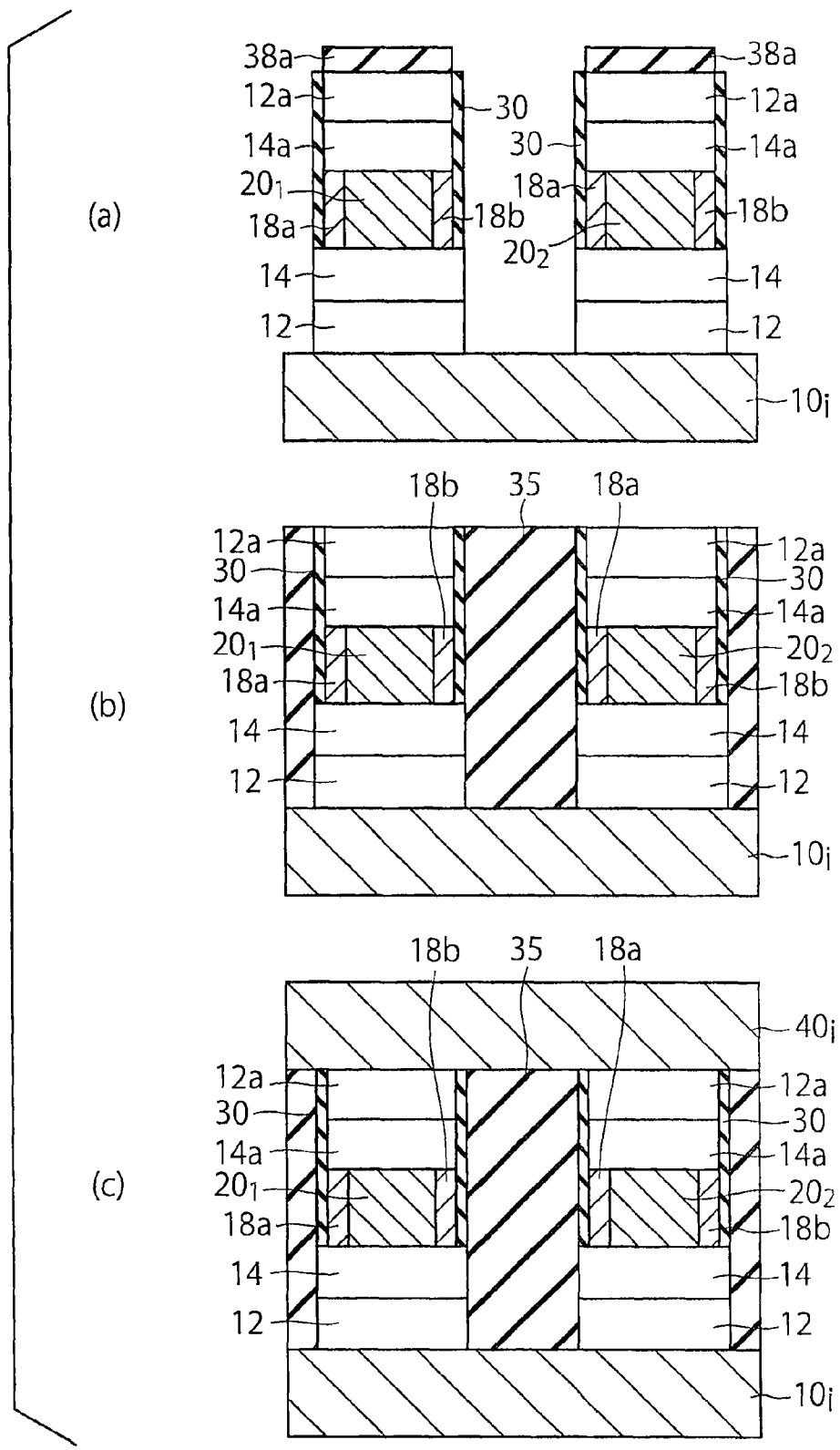
FIGS. 14(a) to 14(c) are cross-sectional views showing the method of manufacturing a nonvolatile memory according to the eighth embodiment.

Next, by using anisotropic etching, for example RIE, the electrode material film 18 is etched so that the electrode layers 18a, 18b are left on the side portions of the electrode wiring line $20_j$ (j=1, ..., 3) (FIG. 13 (a)). Consequently, for example, a SiN film is deposited on the entire surface as a protective film 30 (FIG. 13(b)).

Thereafter, by using anisotropic etching, for example RIE, the protective film 30, the resistance change layer 14, and the polycrystalline silicon layer 12 are patterned (FIG. 14(a)). Consequently, an interlayer insulating film 35 is deposited, and the interlayer insulating film 35 is smoothened by using CMP to expose the upper surface of the polycrystalline silicon layer 12a (FIG. 14(b)). Then, an electrode wiring line material film of a conducting material is deposited, and the electrode wiring line material film is patterned using a lithographic technique to form an electrode wiring line $40_i$ (i=1, ..., 3) (FIG. 14(c)).

In the nonvolatile memory manufactured according to the eighth embodiment, the electrode layers 18a, 18b of the first memory cell are prevented from being removed from the resistance change layer 14 as in the seventh embodiment, and the electrode layers 18a, 18b of the second memory cell are also prevented from being removed from the resistance change layer 14a. As a result, it is possible to prevent the electrical disconnection between the electrode layers 18a, 18b and the resistance change layers 14, 14a, thereby curbing the decrease in yield.

(Ninth Embodiment)

Figure 15:
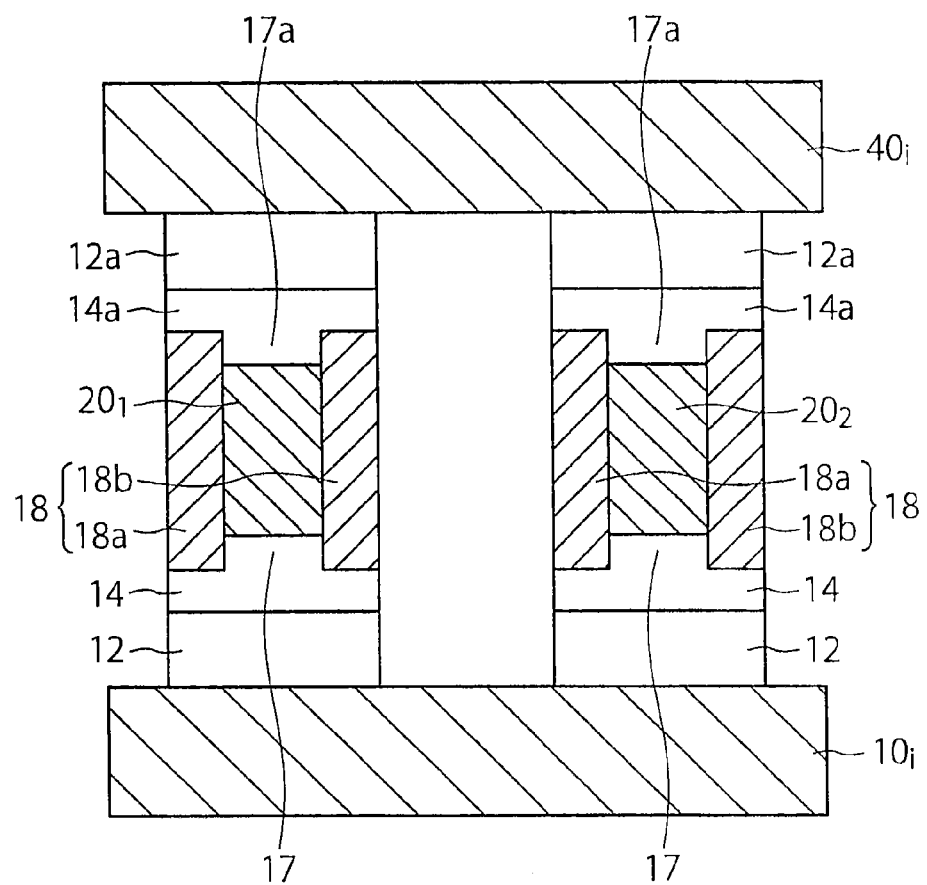
FIG. 15 is a cross-sectional view of a nonvolatile memory according to a ninth embodiment.
Figure 16:
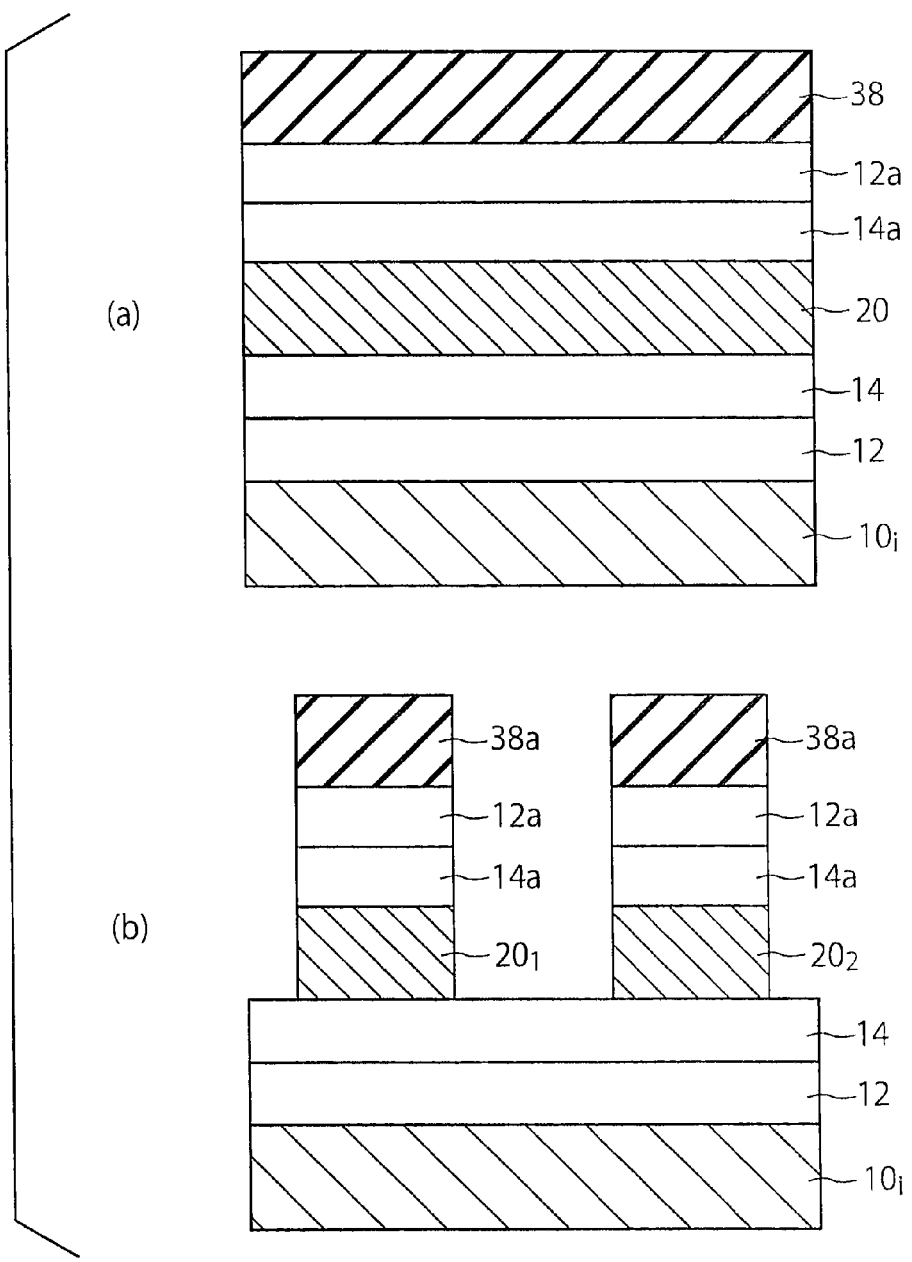
FIGS. 16(a) to 16(b) are cross-sectional views showing a method of manufacturing a nonvolatile memory according to a tenth embodiment.
Figure 17:
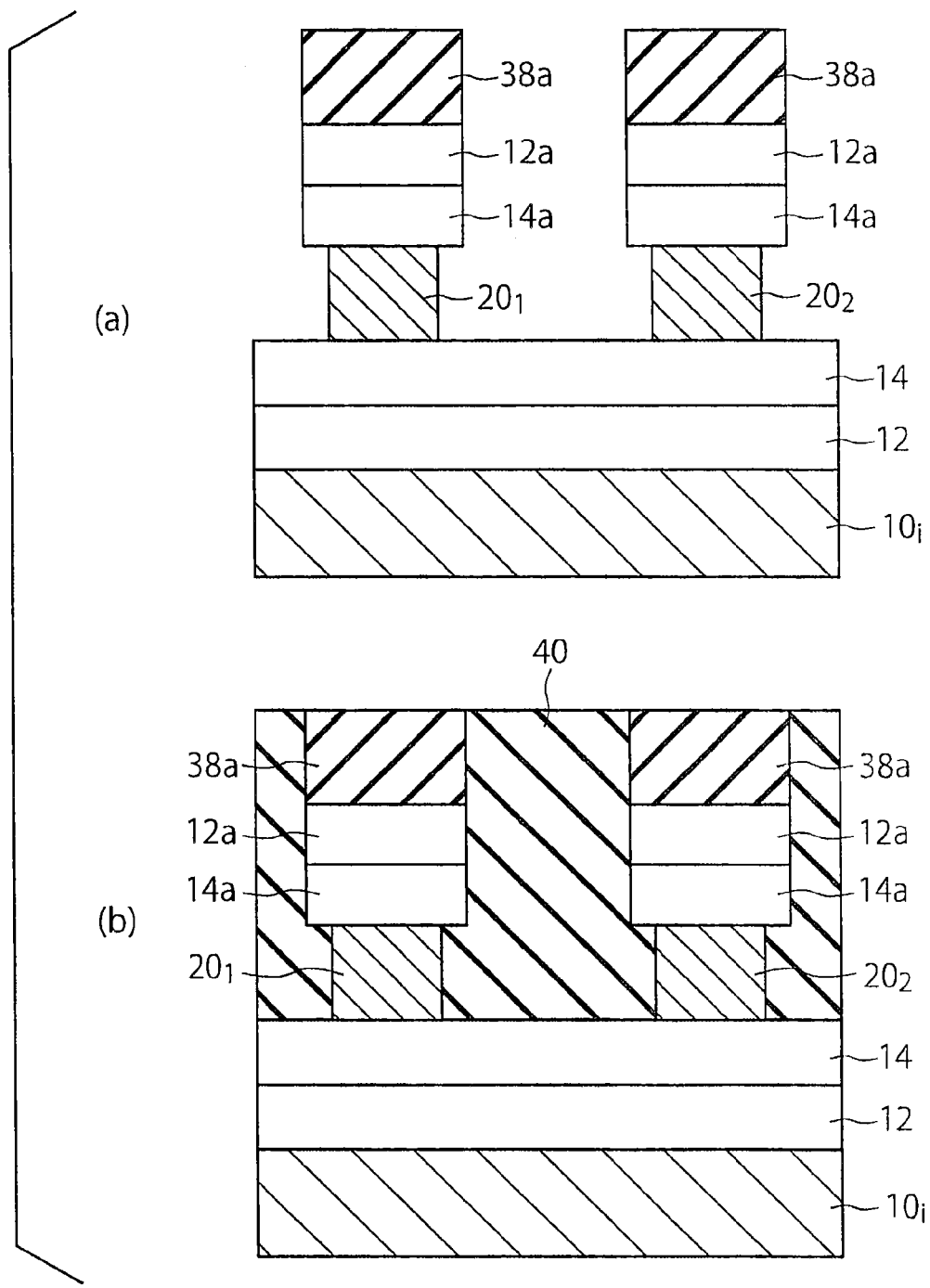
FIGS. 17(a) to 17(b) are cross-sectional views showing the method of manufacturing a nonvolatile memory according to the tenth embodiment.
Figure 18:
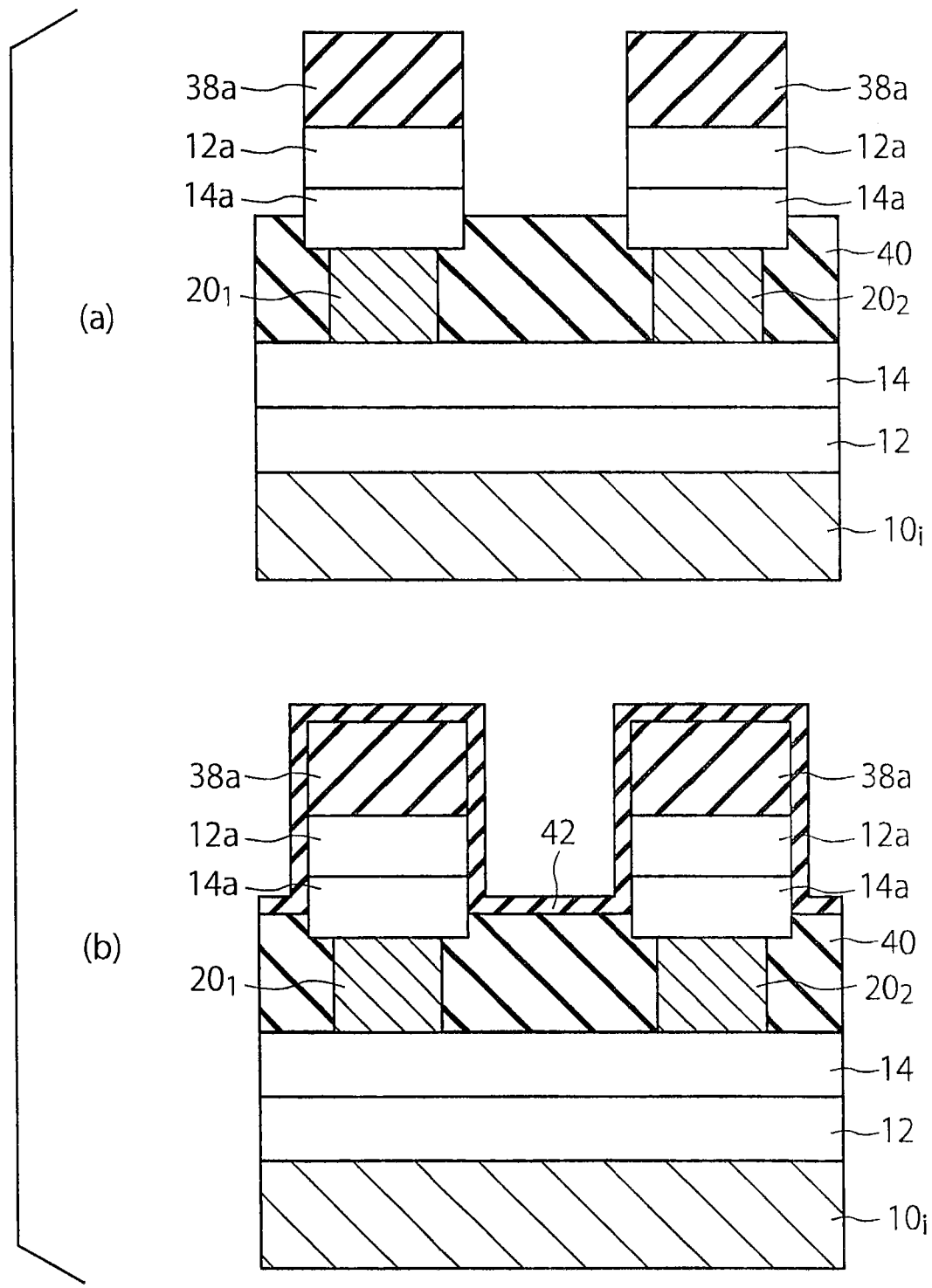
FIGS. 18(a) to 18(b) are cross-sectional views showing the method of manufacturing a nonvolatile memory according to the tenth embodiment.
Figure 19:
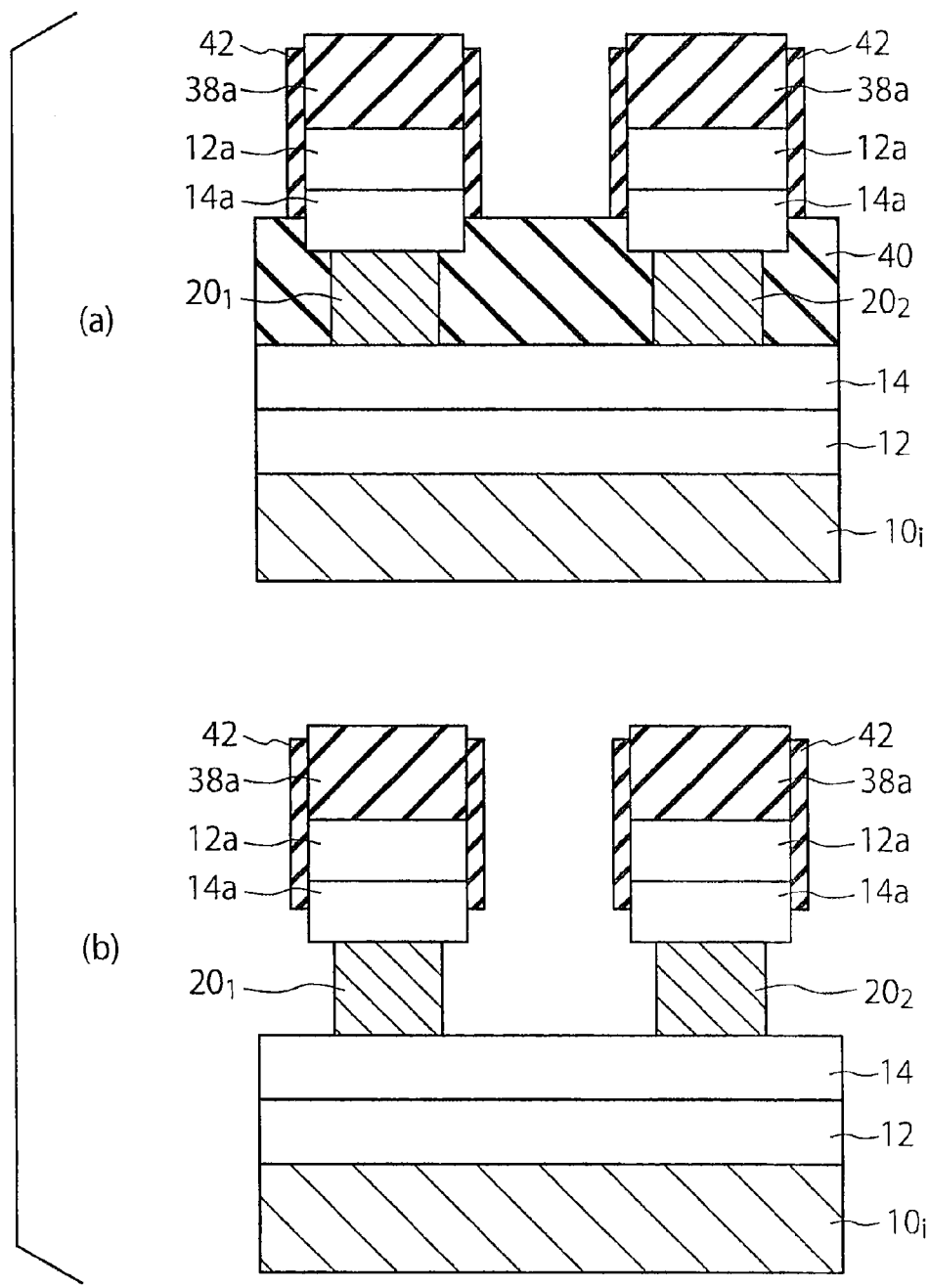
FIGS. 19(a) to 19(b) are cross-sectional views showing the method of manufacturing a nonvolatile memory according to the tenth embodiment.
Figure 20:
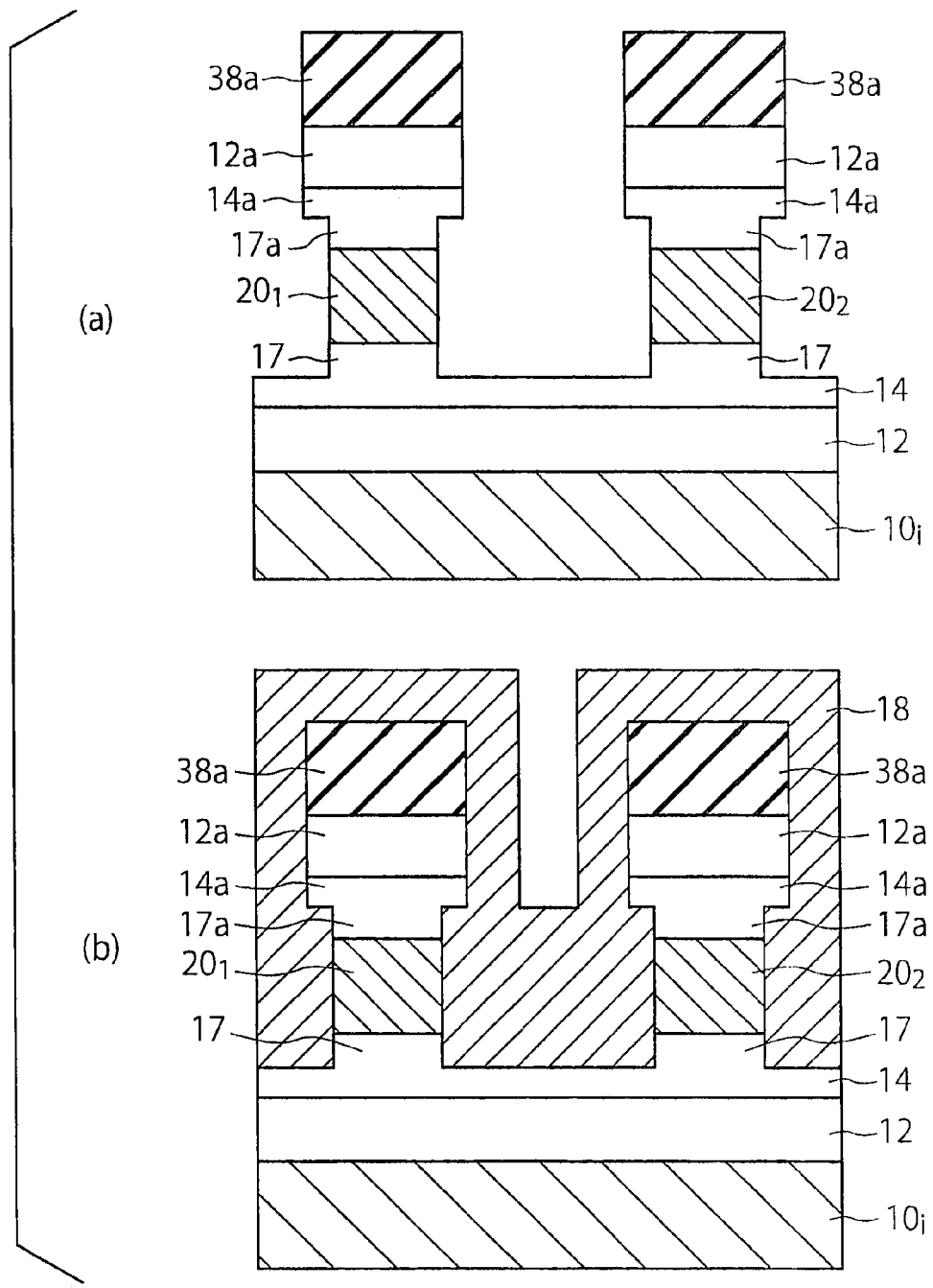
FIGS. 20(a) to 20(b) are cross-sectional views showing the method of manufacturing a nonvolatile memory according to the tenth embodiment.

FIG. 15 shows a nonvolatile memory according to a ninth embodiment, which is obtained by providing a memory cell, the stacking order of which is opposite to that of the memory cell of the second embodiment, onto the memory cell of the nonvolatile memory according to the second embodiment, the two memory cells sharing the electrode layer 18 and the electrode wiring line $20_j$ (j=1, ..., 3).

That is to say, as in the second embodiment, the nonvolatile memory of the ninth embodiment includes a plurality of electrode wiring lines $10_1$-$10_3$ arranged in parallel with each other, a plurality of electrode wiring lines $20_1$-$20_3$ arranged above the electrode wiring lines $10_1$-$10_3$ so as to be parallel with each other and to cross the respective ones of the electrode wiring lines $10_1$-$10_3$, a polycrystalline silicon layer 12 and a resistance change layer 14 arranged in each intersection region of the electrode wiring lines $10_1$-$10_3$ and the electrode wiring lines $20_1$-$20_3$, and an electrode layer 18 containing a metal element and provided onto a side surface of each electrode wiring line $20_j$ (j=1, ..., 3). The polycrystalline silicon layer 12 is arranged on each electrode wiring line $10_i$ (i=1, ..., 3), and the resistance change layer 14 is arranged on the polycrystalline silicon layer 12. The resistance change layer 14 has a projection portion 17 of the same material as the resistance change layer 14 on its upper surface. On this projection portion 17, the electrode wiring lines $20_1$-$20_3$ are arranged.

Furthermore, the nonvolatile memory of the ninth embodiment includes a plurality of electrode wiring lines $40_1$-$40_3$ that cross the respective ones of the electrode wiring lines $20_1$-$20_3$, the electrode wiring lines $40_1$-$40_3$ being located above the electrode wiring line $20_1$-$20_3$ and right above the electrode wiring lines $10_1$-$10_3$, and a resistance change layer 14a and a polycrystalline silicon layer 12a arranged in each intersection region of the electrode wiring lines $20_1$-$20_3$ and the electrode wiring lines $40_1$-$40_3$. The resistance change layer 14a is arranged on each electrode wiring line $20_j$ (j=1, ..., 3) and the electrode layers 18a, 18b, and the polycrystalline silicon layer 12a is arranged on the resistance change layer 14a. The material of the resistance change layer 14a is the same as that of the resistance change layer 14. The resistance change layer 14a has a projection portion 17a at its lower surface, the projection portion 17a being formed of the same material as the resistance change layer 14a. Immediately beneath the projection portion 17a, each of the electrode wiring lines $20_1$-$20_3$ is arranged.

In the nonvolatile memory of the ninth embodiment, the electrode wiring line $10_1$, the polycrystalline silicon layer 12, the resistance change layer 14, the electrode layer 18, and the electrode wiring line $20_j$ in each intersection region of the electrode wiring lines $10_i$ (i=1, ..., 3) and the electrode wiring lines $20_j$ (j=1, ..., 3) forms a first memory cell, and the electrode wiring line $20_j$, the polycrystalline silicon layer 12a, the resistance change layer 14a, the electrode layers 18a, 18b, and the electrode wiring line $40_i$ in each intersection region of the electrode wiring lines $20_j$ (j=1, ..., 3) and the electrode wiring lines $40_i$ (i=1, ..., 3) forms a second memory cell. That is to say, the second memory cell is arranged above the first memory cell, the layer staking order the second memory cell being opposite to that of the first memory cell.

As described above, as in the second embodiment, it is possible to prevent the electrode layers 18a, 18b of the first memory cell from being removed from the resistance change layer 14 in the ninth embodiment, and also it is possible to prevent the electrode layers 18a, 18b of the second memory cell from being removed from the resistance change layer 14a. As a result, it is possible to prevent the electrical disconnection between the electrode layers 18a, 18b and the resistance change layers 14, 14a, thereby curbing the decrease in yield.

Furthermore, as in the second embodiment, it is possible to increase the electric field intensity of a corner portion at which the upper surface of the resistance change layer 14 is connected to the projection portion 17 in the ninth embodiment, and also it is possible to increase the electric field intensity of a corner portion at which the upper surface of the resistance change layer 14a is connected to the projection portion 17a. As a result, it is possible to increase the speed for forming the filament, thereby improving the write speed.

Although the ninth embodiment has been explained using the memory cell of the second embodiment, it is possible to use the memory cell of either of the third and the fourth embodiments instead of the memory cell of the second embodiment. For example, the memory cell of the fourth embodiment can be used as the first and the second memory cells of the ninth embodiment.

(Tenth Embodiment)

A method of manufacturing a nonvolatile memory according to a tenth embodiment will be explained by referring to FIGS. 16(a) to 21(b). The tenth embodiment is a method of manufacturing a nonvolatile memory according to the ninth embodiment shown in FIG. 15.

First, an electrode wiring line material layer of a conductive material, a polycrystalline silicon layer, and a resistance-change-material layer are sequentially stacked, and the resistance-change-material layer, the polycrystalline silicon layer, and the electrode wiring line material layer are patterned into an electrode wiring line shape using a lithographic technique, thereby forming a stacked structure including an electrode wiring line $10_i$ (i=1, ..., 3), a polycrystalline silicon layer 12, and a resistance change layer 14 (FIG. 16(a)). Thereafter, an insulating layer (not shown in the drawings) is deposited to fill the spaces between such stacked structures in the electrode wiring line shape, and the insulating layer is smoothed by using CMP (Chemical Mechanical Polishing), thereby exposing the upper surface of the resistance change layer 14. Consequently, an electrode wiring line material layer 20 of a conductive material, a resistance change layer 14a, a polycrystalline silicon layer 12a, and a hard mask material layer 38 are sequentially stacked on the entire surface (FIG. 16(a)). As a material of the hard mask material layer 38, alumina (AlOx), silicon nitride (SiN), etc. can be used.

Next, the hard mask material layer is patterned using a lithographic technique to form a hard mask 38a. By using this hard mask 38a, the polycrystalline silicon layer 12a, the resistance change layer 14a, and the electrode wiring line material layer 20 are patterned, thereby forming separated cells each including the polycrystalline silicon layer 12a, the resistance change layer 14a, and an electrode wiring line $20_j$ (j=1, ..., 3) (FIG. 16(b)).

Then, the side portions of each electrode wiring line $20_j$ (j=1, ..., 3) are etched by, for example, wet etching or isotropic dry etching to narrow the width of the electrode wiring line $20_j$ (j=1, ..., 3) (FIG. 17(a)). Consequently, a sacrificial film, for example a $SiO_2$ film 40, is deposited to fill the side portions of the electrode wiring line $20_j$ (j=1, ..., 3). Thereafter, the $SiO_2$ film 40 is smoothed by using CMP, etc., thereby exposing the upper surface of the hard mask 38a (FIG. 17(b)).

Next, the sacrificial film 40 is etched by anisotropic etching, for example RIE, so that parts of the side surfaces of the resistance change layer 14a are exposed, and the other parts are covered by the sacrificial film 40 (FIG. 18(a)). Consequently, a protective film, for example a SiN film 42, is deposited on the entire surface (FIG. 18(b)).

Next, by anisotropic etching, for example RIE, the protective film 42 on the sacrificial film 40 is removed (FIG. 19(a)). Consequently, the sacrificial film 40 is removed by isotropic etching, for example wet etching or dry etching (FIG. 19(b)).

Then, the protective film 42 is removed by isotropic etching, for example wet etching or dry etching. On such an occasion, the parts of the resistance change layer 14a not covered by the protective film 42, the side portions of the electrode wiring lines $20_1$-$20_3$, and a part of the side surfaces of the resistance change layer 14 are etched so that the diameter of the sectioned area cut by a plane perpendicular to the stacking direction is narrowed. As a result, projection portions 17 and 17a are formed on the upper surface of the resistance change layer 14, and the lower surface of the resistance change layer 14a, respectively (FIG. 20(a)). Consequently, an electrode layer material film 18 is deposited to fill the spaces among the resistance change layer 14 located below, the electrode wiring lines $20_1$-$20_3$, and the resistance change layers 14a located above (FIG. 20(b)).

Figure 21:
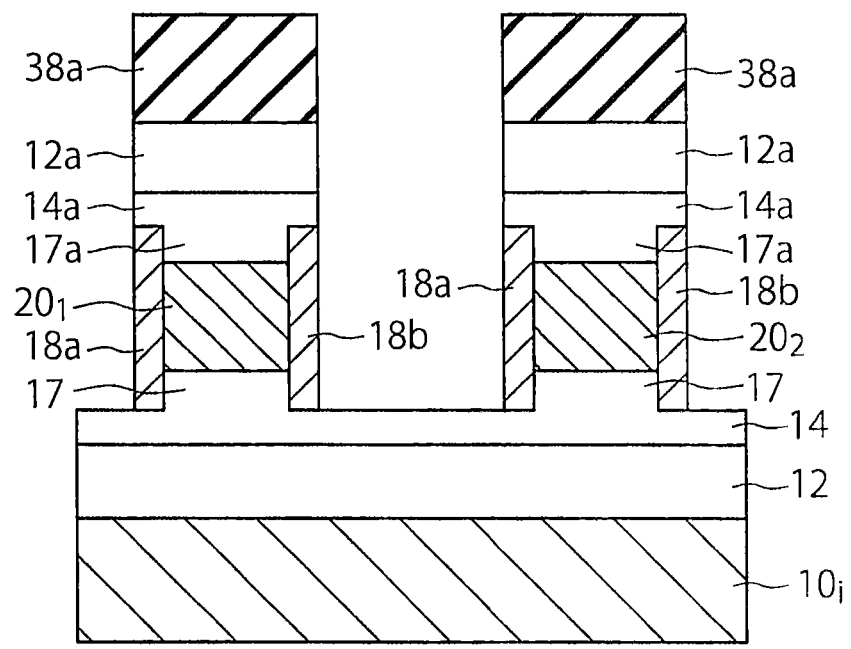
FIG. 21 is a cross-sectional view showing the method of manufacturing a nonvolatile memory according to the tenth embodiment.

Next, the electrode layer material film 18 is etched by using anisotropic etching, for example RIE, to form electrode layers 18a, 18b formed of electrode material film on the side surfaces of the electrode wiring lines $20_i$ (i=1, ..., 3) (FIG. 21). Thereafter, as in the seventh embodiment, an interlayer insulating film (not shown in the drawings) is deposited, and then the interlayer insulating film is smoothened by CMP, thereby exposing the upper surface of the polycrystalline silicon layer 12a. Consequently, an electrode wiring line material film of a conductive material is deposited, and the electrode wiring line material film is patterned by using a lithographic technique to form electrode wiring lines $40_i$ (i= 1, ..., 3) (FIG. 15).

As in the ninth embodiment, in the nonvolatile memory manufactured according to the tenth embodiment, it is possible to prevent the electrode layers 18a, 18b of the first memory cell from being removed from the resistance change layer 14, and also it is possible to prevent the electrode layers 18a, 18b of the second memory cell from being removed from the resistance change layer 14a. As a result, it is possible to prevent the electrical disconnection between the electrode layers 18a, 18b and the resistance change layers 14, 14a, thereby curbing the decrease in yield.

Furthermore, as in the ninth embodiment, in the nonvolatile memory manufactured according to the tenth embodiment, it is possible to increase the electric field intensity at a corner portion at which the upper surface of the resistance change layer 14 is connected to the projection portion 17, and also it is possible to increase the electric field intensity at a corner portion at which the upper surface of the resistance change layer 14a is connected to the projection portion 17a. As a result, it is possible to increase the speed for forming the filament, thereby improving the write speed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A nonvolatile memory comprising:
   a first wiring line;
   a second wiring line arranged above the first wiring line and extending in a direction crossing the first wiring line; and
   a resistance change layer arranged in an intersection region of the first wiring line the second wiring line,
   the second wiring line including a first member extending in the direction in which the second wiring line extends, and an electrode layer containing a metal element, the first member having a lower surface, an upper surface opposed to the lower surface, and a side surface different from the lower and upper surfaces, the electrode layer being arranged on the side surface of the first member along the direction in which the second wiring line extends, a lower surface of the electrode layer being in direct contact with an upper surface of the resistance change layer.

2. The nonvolatile memory according to claim 1, wherein the first member is formed of a conductive material.

3. The nonvolatile memory according to claim 1, wherein the lower surface of the first member is positioned higher than the lower surface of the electrode layer.

4. The nonvolatile memory according to claim 2, further comprising a second member arranged along the direction in which the second wiring line extends, an upper surface of the second member being in contact with a lower surface of the second wiring line, a side surface of the second member being in contact with the electrode layer, and a lower surface of the second member being in contact with the upper surface of the resistance change layer in the intersection region.

5. The nonvolatile memory according to claim 4, wherein a material of the second member is the same as a material the resistance change layer.

6. The nonvolatile memory according to claim 4, wherein the second member is formed of an insulating material that is different from a material of the resistance change layer.

7. The nonvolatile memory according to claim 1, wherein the first member is formed of an insulating material.

8. The nonvolatile memory according to claim 7, further comprising a barrier metal layer arranged between the first member and the electrode layer.

9. The nonvolatile memory according to claim 1, further comprising a polycrystalline silicon layer arranged between the resistance change layer and the first wiring line.

10. A nonvolatile memory comprising:
    a first wiring line;
    a second wiring line arranged above the first wiring line and extending in a direction crossing the first wiring line;
    a first electrode arranged in an intersection region of the first wiring line and the second wiring line, the first electrode having a lower surface, an upper surface opposed to the lower surface, and a side surface different from the lower and upper surfaces, the lower surface of the first electrode being in direct contact with the first wiring line;

a resistance change layer arranged in the intersection region and covering the side surface and the upper surface of the first electrode, the resistance change layer having a lower surface, an upper surface opposed to the lower surface, and a side surface different from the lower and upper surfaces; and a second electrode containing a metal element, arranged to be in direct contact with the side surface of the resistance change layer and opposing to the first electrode with the resistance change layer being located therebetween, an upper surface of the second electrode being in direct contact with the second wiring line.

11. The nonvolatile memory according to claim 10, wherein the second electrode extends between the upper surface of the resistance change layer and the second wiring line.

12. The nonvolatile memory according to claim 10, further comprising a polycrystalline silicon layer arranged between the resistance change layer and the first electrode.

13. A nonvolatile memory comprising:
a first wiring line;
a second wiring line arranged above the first wiring line and extending in a direction crossing the first wiring line;
a third wiring line arranged above the second wiring line and crossing the second wiring line;
a first resistance change layer arranged in an intersection region of the first wiring line and the second wiring line; and
a second resistance change layer arranged in an intersection region of the second wiring line and the third wiling line,
the second wiring line including a first member extending in the direction in which the second wiring line extends, and an electrode layer containing a metal element arranged on a side surface of the first member along the direction in which the second wiring line extends, a lower surface of the electrode layer being in contact with an upper surface of the first resistance change layer, and an upper surface of the electrode layer being in contact with a lower surface of the second resistance change layer.

14. The nonvolatile memory according to claim 13, wherein the first member is formed of a conductive material.

15. The nonvolatile memory according to claim 13, wherein a lower surface of the first member is positioned higher than the lower surface of the electrode layer, and an upper surface of the first member is positioned lower than the upper surface of the electrode layer.

16. The nonvolatile memory according to claim 14, further comprising:
a second member arranged along the direction in which the second wiring line extends, an upper surface of the second member being in contact with a lower surface of the second wiring line, a side surface of the second member being in contact with the electrode layer, and a lower surface of the second member being in contact with an upper surface of the first resistance change layer in the intersection region of the first wiring line and the second wiring line; and
a third member arranged along the direction in which the second wiring line extends, a lower surface of the third member being in contact with an upper surface of the second wiring line, a side surface of the third member being in contact with the electrode layer, and an upper surface of the third member being in contact with a lower surface of the second resistance change layer in the intersection region of the third wiring line and the second wiring line.

17. The nonvolatile memory according to claim 16, wherein materials of the second and third members are the same as a material of the resistance change layer.

18. The nonvolatile memory according to claim 16, wherein the second and third members are formed of an insulating material that is different from a material of the resistance change layer.

19. The nonvolatile memory according to claim 13, wherein the first member is formed of an insulating material.

20. The nonvolatile memory according to claim 13, further comprising a polycrystalline silicon layer arranged between the first resistance change layer and the first wiring line, and a polycrystalline silicon layer arranged between the second resistance change layer and the second wiring line.

* * * * *